(12) United States Patent
Jin et al.

(10) Patent No.: US 11,881,138 B2
(45) Date of Patent: Jan. 23, 2024

(54) DRIVE CIRCUIT AND DISPLAY DEVICE

(71) Applicant: Shanghai AVIC Optoelectronics Co., Ltd., Shanghai (CN)

(72) Inventors: Huijun Jin, Shanghai (CN); Dandan Qin, Shanghai (CN)

(73) Assignee: Shanghai AVIC Optoelectronics Co., Ltd., Shanghai (CN)

( * ) Notice: Subject to any disclaimer, the term of this patent is extended or adjusted under 35 U.S.C. 154(b) by 21 days.

(21) Appl. No.: 17/686,638

(22) Filed: Mar. 4, 2022

(65) Prior Publication Data

US 2022/0189372 A1 Jun. 16, 2022

(30) Foreign Application Priority Data

Dec. 30, 2021 (CN) .......................... 202111653970.8

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01); *G09G 2310/08* (2013.01)

(58) Field of Classification Search
CPC ............. G09G 3/20; G09G 2310/0286; G09G 2310/08; G11C 19/28
See application file for complete search history.

(56) References Cited

U.S. PATENT DOCUMENTS

| | | | |
|---|---|---|---|
| 2018/0090090 A1* | 3/2018 | Feng | G09G 3/3622 |
| 2018/0122315 A1* | 5/2018 | Zhang | G09G 3/3611 |
| 2018/0197448 A1* | 7/2018 | Zhang | G09G 3/20 |
| 2018/0204521 A1* | 7/2018 | Gu | G09G 3/3677 |
| 2018/0204628 A1* | 7/2018 | Gao | G11C 19/28 |
| 2021/0174720 A1* | 6/2021 | Lin | G09G 3/20 |
| 2021/0174723 A1* | 6/2021 | Yang | G09G 3/20 |
| 2021/0175754 A1* | 6/2021 | Kim | H02J 50/402 |

FOREIGN PATENT DOCUMENTS

| | | |
|---|---|---|
| CN | 111627404 A | 9/2020 |
| CN | 111816107 A | 10/2020 |

* cited by examiner

*Primary Examiner* — Sejoon Ahn
(74) *Attorney, Agent, or Firm* — KDW Firm PLLC

(57) ABSTRACT

A drive circuit includes: a first shift register, a first signal line, a second signal line, and a drive module. The first shift register includes a first node and a second node, the first signal line provides a first input signal for the first shift register, the second signal line provides a second input signal for the first shift register, and the first shift register controls potentials of the first node and the second node according to the first input signal and the second input signal. The drive module is electrically connected to the first node, the second node, the first signal line and the second signal line separately, detects the potentials of the first node and the second node, and adjusts at least one of the first input signal and the second input signal according to a potential detection result of the first node and the second node.

20 Claims, 14 Drawing Sheets

DRIVE CIRCUIT AND DISPLAY DEVICE

CROSS-REFERENCE TO RELATED APPLICATION(S)

This application claims priority to Chinese Patent Application No. 202111653970.8 filed Dec. 30, 2021, the disclosure of which is incorporated herein by reference in its entirety.

TECHNICAL FIELD

The present disclosure relates to a display technology and, in particular, to a drive circuit and a display device.

BACKGROUND

With the development of display technologies, the integration level of the display panel is getting higher and higher, and the cost is getting lower and lower. The development of amorphous silicon gate (ASG) has become a new topic. The gate drive circuit is directly integrated on the glass substrate by using the ASG technology, which can effectively improve the integration level of the display device and reduce the manufacturing cost of the display device while achieving the narrow bezel design.

The ASG circuit usually includes multi-stage shift register units. An output terminal of each stage shift register unit corresponds to and is electrically connected to a respective one of scanning signal lines. A scanning signal at a valid level is sequentially output to each scanning signal line to achieve a progressive scanning function, so that the display panel shows corresponding display pictures.

When the existing display panel works in a high temperature and high humidity environment, since a transistor electrically connected to a signal output terminal of each shift register unit and a corresponding node has an inherent leakage current, the signal output terminal of each shift register unit and the corresponding node cannot be kept at a normal potential of the scanning signal, so that potentials at the signal output terminal and the corresponding node are drifted, and thus the G line where the output terminal of the shift register unit is located in the display panel is jittered.

SUMMARY

The present disclosure provides a drive circuit and a display device.

In a first aspect, provided is a drive circuit. The drive circuit includes a first shift register, a first signal line, a second signal line, and a drive module.

The first shift register includes a first node and a second node, the first signal line is configured to provide a first input signal for the first shift register, the second signal line is configured to provide a second input signal for the first shift register, and the first shift register is configured to control a potential of the first node and a potential of the second node according to the first input signal and the second input signal.

The drive module is electrically connected to the first node, the second node, the first signal line and the second signal line separately, and the drive module is configured to detect the potential of the first node and the potential of the second node, and adjust at least one of the first input signal and the second input signal according to a potential detection result of the first node and the second node.

In a second aspect, further provided is a display device. The display device includes the drive circuit described above.

In the embodiments of the present disclosure, the first shift register is provided, the first input signal is provided for the first shift register by the first signal line, the second input signal is provided for the first shift register by the second signal line, so that the first shift register works under the action of the first input signal and the second input signal. In this case, the first shift register controls the potential of the first node and the potential of the second node according to the first input signal and the second input signal. The potential of the first node and the potential of the second node are detected by the drive module, and at least one of the first input signal and the second input signal are adjusted according to a potential detection result of the first node and the second node.

BRIEF DESCRIPTION OF DRAWINGS

To illustrate the solutions in the embodiments of the present disclosure or the solutions in the existing art more clearly, drawings used in the description of the embodiments or the existing art will be briefly described below. Apparently, although the drawings described below illustrate part of specific embodiments of the present disclosure, those skilled in the art may expand and extend to other structures and drawings according to the basic concepts of the device structure, driving method, and manufacturing method disclosed and indicated in embodiments of the present disclosure. These are undoubtedly all within the scope of the claims of the present disclosure.

DETAILED DESCRIPTION

The solutions of the present disclosure will be described clearly and completely with reference to the drawings through embodiments from which the object, technical solutions and advantages of the present disclosure will be apparent. Apparently, the embodiments described below are merely a part, not all, of embodiments of the present disclosure. Based on the basic concepts disclosed and suggested by embodiments of the present disclosure, all other embodiments obtained by those skilled in the art are within the scope of the present disclosure.

Figure 1:
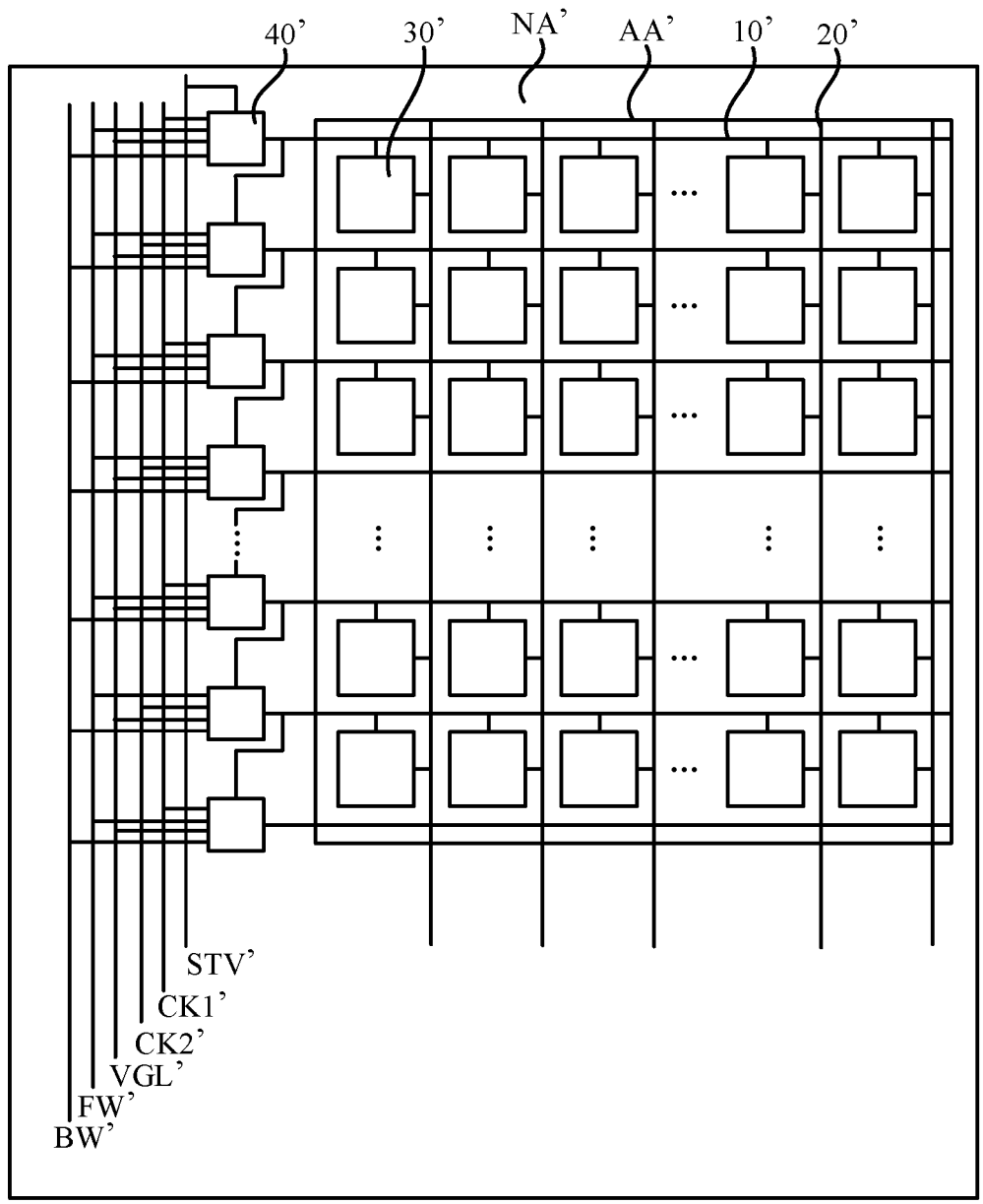
FIG. 1 is a structure diagram of an amorphous silicon gate (ASG) circuit in the related art.
Figure 2:
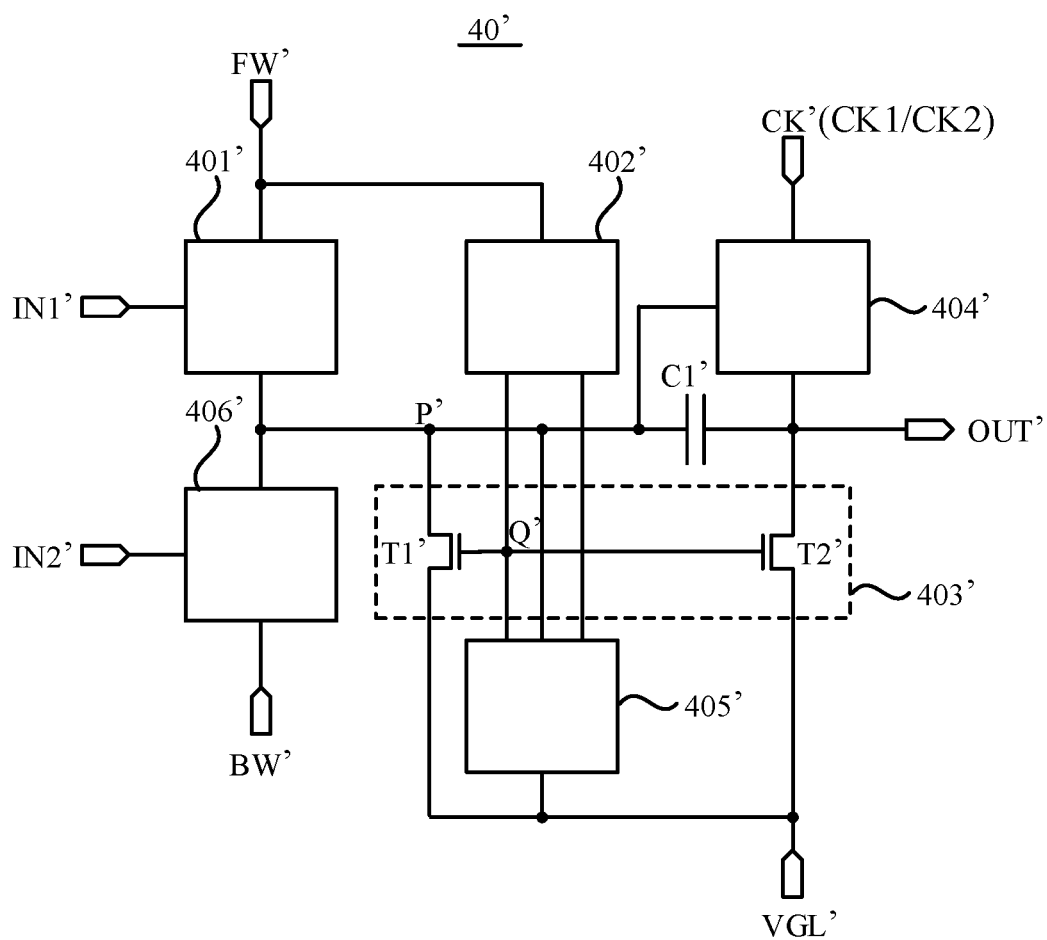
FIG. 2 is a circuit structure diagram of a shift register unit of FIG. 1.
Figure 3:
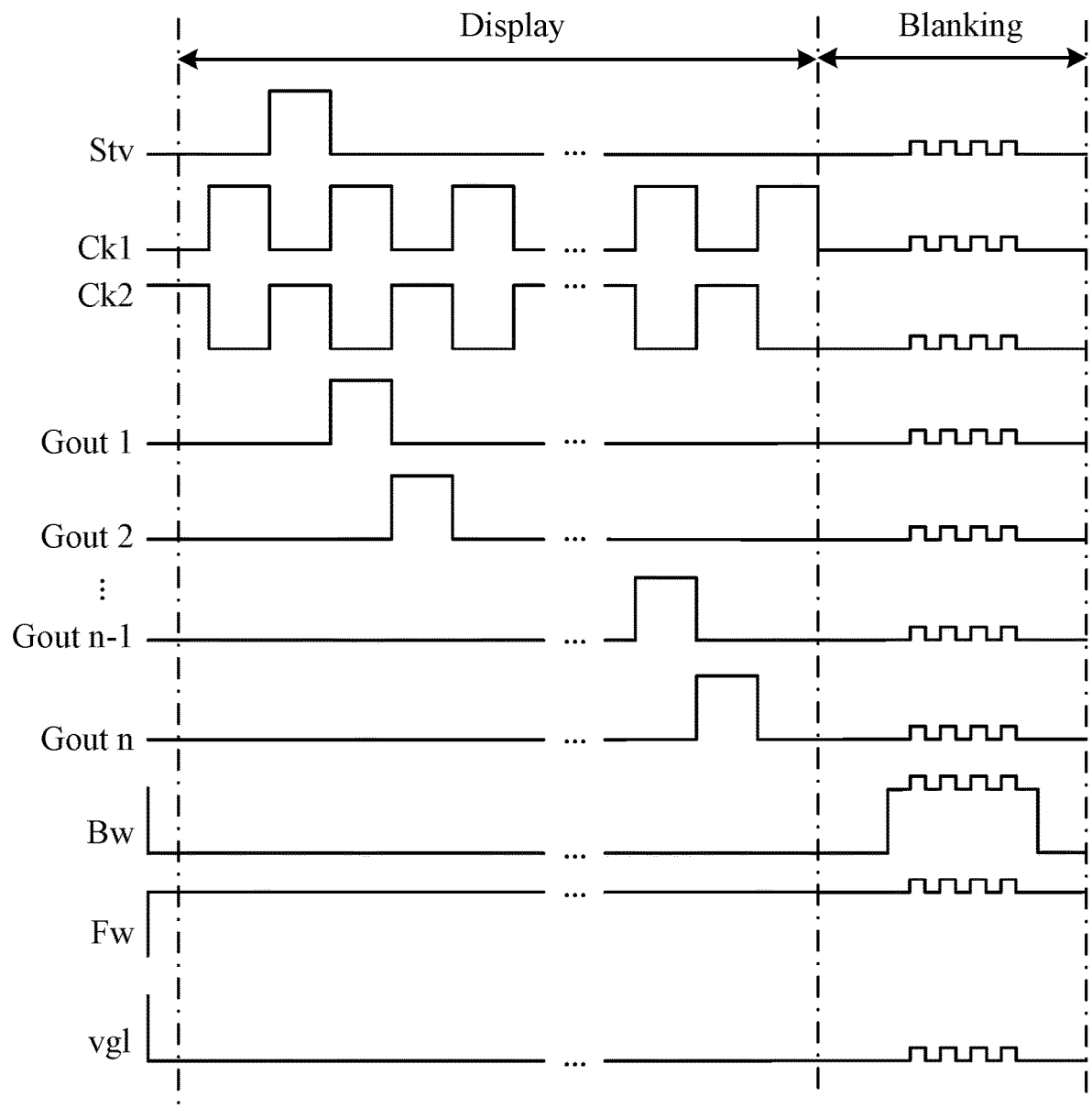
FIG. 3 is a driving timing diagram of a shift register unit of FIG. 2.

FIG. 1 is a structure diagram of an amorphous silicon gate (ASG) circuit in the related art. FIG. 2 is a circuit structure diagram of a shift register unit of FIG. 1. FIG. 3 is a driving timing diagram of a shift register unit of FIG. 2. In conjunction with FIGS. 1, 2 and 3, a display panel includes a display area AA' and a non-display area NA'. The display area AA' includes multiple scanning lines 10' and multiple data lines 20'. The scanning lines 10' and the data lines 20' define sub-pixels 30' distributed in multiple rows and multiple columns. In the non-display area NA', the ASG circuit generally includes multiple cascaded shift register units 40'. Each shift register unit 41' includes an input module 401', a pull-down control module 402', a pull-down module 403', an output module 404', a pull-up module 405', a shut-down module 406', a storage capacitor C1', a signal control terminal FW', a shut-down control terminal BW', a power supply signal terminal VGL', a signal output terminal OUT', a signal input terminal IN1'/IN2', and a clock signal terminal CK' (CK1' or CK2'). The output terminal OUT' of each shift register unit 40' is electrically connected to a respective one of the scanning signal lines 10', and a scanning signal at an enable level is sequentially output to each scanning signal line 10' so as to achieve a progressive scanning function, and then in combination with an output signal of the data line 20', the display panel shows corresponding display pictures.

In the existing art, during the image display of the display panel, the display panel can display multiple frames of display pictures, that is, including multiple scanning periods, and each scanning period includes a display stage Display and a display blank stage Blanking.

If the pull-down control module 402' in the display blank stage Blanking continuously provides a high level of a scanning control signal FW from the scanning control terminal FW' to a node Q', transistors T1' and T2' maintain at a continuous conduction state during the display blank stage Blanking, and then a discharge path is formed from a node P' to the power supply signal terminal VGL' through the transistor T1', which causes the reduction of charges at the node P' of the shift register unit 40'. Especially in the working environment of high temperature and high humidity, the carrier activity inside the transistor in the shift register unit 40' is relatively high, the characteristics of the transistor drift, characteristics of the shift register unit 40' also drift gradually, so the shift register unit 40' has a more obvious influence on a potential at the node P'. Therefore, the driving ability of the node P' becomes weaker and weaker, and the driving ability of the node Q' becomes stronger and stronger, so that the phenomenon that the driving abilities of the node P' and the node Q' are mismatched due to too large driving ability difference between nodes occurs. When the driving ability difference between the node P' and the node Q' is getting larger and larger, the node P' and the node Q' cannot clamp each other, and even a case where the node Q' always clamps the node P' occurs; in this case, the shift register unit 40' outputs abnormally, and the line G' where the output terminal OUT' of the shift register unit 40' is located is jittered, thereby affecting the normal display of the next frame of display picture and affecting the display quality of the display panel.

In addition, in the practical application process of the ASG circuit, due to different working situations, if the input module 401' in the display blank stage Blanking continuously provides a high level of the scanning control signal Fw of the scanning control terminal FW' to the node P', the discharge path is formed from the node Q' to the power supply signal terminal VGL' through the pull-up module 405'. In this case, charges at the node Q' of the shift register unit 40' are reduced, and the phenomenon that the driving ability of the node P' becomes stronger and stronger and the driving ability of the node Q' becomes weaker and weaker may also occur, so that the driving ability difference between the node P' and the node Q' is getting larger and larger, the node P' and the node Q' cannot clamp each other, and even a case where the node Q' always clamps the node P' occurs. In this case, the line G' may also be caused to be jittered, thereby affecting the normal display of the next frame of display picture and affecting the display quality of the display panel.

Based on the above technical problems, the embodiments of the present disclosure provide a drive circuit. The drive circuit includes: a first shift register, a first signal line and a second signal line, and a drive module. The first shift register includes a first node and a second node, the first signal line provides a first input signal for the first shift register, the second signal line provides a second input signal for the first shift register, and the first shift register is configured to control a potential of the first node and a potential of the second node according to the first input signal and the second input signal. The drive module is electrically connected to the first node, the second node, the first signal line and the second signal line separately, and is configured to detect the potential of the first node and the potential of the second node, and adjust at least one of the first input signal and the second input signal according to a potential detection result of the first node and the second node.

With the preceding solutions, the first shift register is arranged in the display device, the first input signal is provided for the first shift register by the first signal line, the second input signal is provided for the first shift register by the second signal line, so that the first register works under the action of the first input signal and the second input signal. In this case, the first shift register controls the potential of the first node and the potential of the second node according to the first input signal and the second input signal.

The drive module is configured to detect the potential of the first node and the potential of the second node, and adjust at least one of the first input signal and the second input signal according to the potential detection result of the first node and the second node, so as to stabilize the potential of the first node and the potential of the second node in the first shift register, and reduce the driving ability difference between the first node and the second node. Apparently, if the drive abilities of the first node and the second node are mismatched caused by the characteristic drift generated inside the shift register, the drive module can adjust the driving ability of the first node and the second node by detecting the potential of the first node and the potential of the second node, so as to ensure the stable output of the first shift register, thereby ensuring the working stability of the drive circuit and improving the display quality of the display screen.

The above is the core idea of the present application, solutions in the embodiments of the present disclosure will be described clearly and completely in conjunction with the drawings in the embodiments of the present disclosure. Apparently, the embodiments described below are part, not all of the embodiments of the present disclosure. Based on the embodiments of the present disclosure, all other embodiments obtained by those skilled in the art without creative work are within the scope of the present disclosure.

Figure 4:
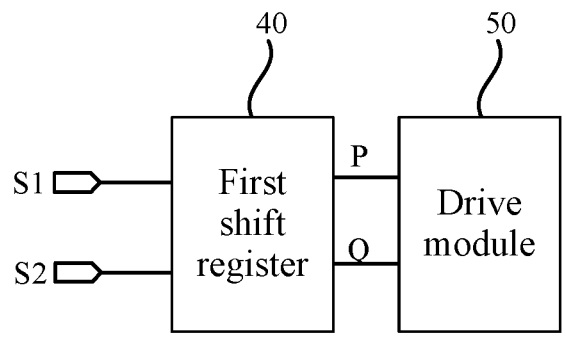
FIG. 4 is a structure diagram of a drive circuit provided by an embodiment of the present disclosure.

FIG. 4 is a structure diagram of a drive circuit provided by an embodiment of the present disclosure. As shown in FIG. 4, the drive circuit includes: a first shift register 40, a first signal line S1, a second signal line S2 and a drive module 50. The first shift register 40 includes a first node P and a second node Q. A first input signal s1 is provided for the first shift register 40 by the first signal line S1, a second input signal s2 is provided for the first shift register 40 by the second signal line S2, and the first shift register 40 is configured to control a potential of the first node P and a potential of the second node Q according to the first input signal s1 and the second input signal s2, respectively. The drive module 50 is electrically connected to the first node P, the second node Q, the first signal line S1 and the second signal line S2 separately, and the drive module 50 is configured to detect the potential of the first node P and the potential of the second node Q, and adjust at least one of the first input signal s1 and the second input signal s2 according to a potential detection result of the first node P and the second node Q.

Figure 5:
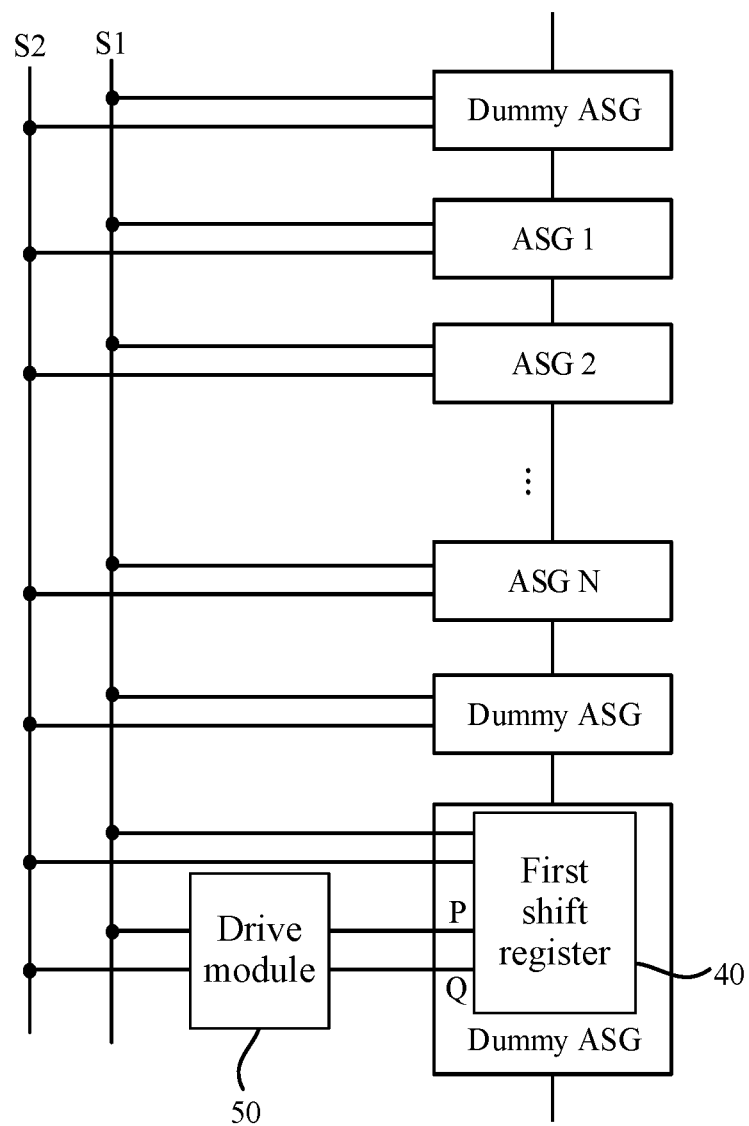
FIG. 5 is a structure diagram of an ASG circuit provided by an embodiment of the present disclosure.

It can be understood that FIG. 5 is a structure diagram of an ASG circuit provided by an embodiment of the present disclosure, in conjunction with FIGS. 4 and 5, the ASG circuit generally includes multiple cascaded shift registers, including a gate drive circuit ASG (ASG1, ASG2, ..., ASGn) for providing a scanning signal for a gate of a display transistor and a dummy ASG. The ASG and the dummy ASG are electrically connected to the first signal line S1 and the second signal line S2, respectively, and an output terminal of the ASG is electrically connected to the scanning signal line (not shown in the figure). The ASG circuit is configured to drive a gate of an array substrate of the display device. Typically, the dummy ASG is arranged in at least one of the following locations: before an ASG corresponding to a first row of scanning lines, and after an ASG corresponding to a last row of scanning lines. A stage in which the row where the dummy ASG is located is scanned usually is the display blank stage Blanking, and the corresponding display picture is kept unchanged.

One dummy ASG is newly provided in the ASG circuit, and the first shift register 40 is located within the newly provided dummy ASG. Exemplarily, FIG. 5 shows that the newly provided dummy ASG is located after the last row of dummy ASG. The drive module 50 is electrically connected to the first shift register 40. The first shift register 40 is provided with the first signal line S1 and the second signal line S2 which are used for driving the first shift register 40 to output stably. The first signal line S1 is, for example, a signal line for adjusting the potential of the first node P, and the second signal line S2 is, for example, a signal line for adjusting the potential of the second node Q. In a case where the drive module 50 detects the potential of the first node P and the potential of the second node Q in the first shift register 40 in real time, and determines that a potential difference between the first node P and the second node Q is larger and larger and the potential of the first node P is greater than the potential of the second node Q, the drive module 50 may adjust the input signal s1 of the first signal line S1 to lower the potential of the first node P, or adjust the input signal s2 of the second signal line S2 to raise the potential of the second node Q, so as to reduce the potential difference between the potential of the first node P and the potential of the second node Q. Similarly, in a case where the drive module 50 detects the potential of the first node P and the potential of the second node Q in the first shift register 40 in real time, and determines that the potential difference between the first node P and the second node Q is larger and larger and the potential of the second node Q is greater than the potential of the first node P, the drive module 50 may adjust the input signal s1 of the first signal line S1 to raise the potential of the first node P, or adjust the input signal s2 of the second signal line S2 to lower the potential of the second node Q, so as to reduce the potential difference between the potential of the first node P and the potential of the second node Q. In this way, the drive module 50 can detect the potential of the first node P and the potential of the second node Q in the first shift register 40 in real time, and adjust at least one of the first input signal s1 and the second input signal s2 according to the potential detection result of the first node P and the second node Q to ensure the potential of the first node P and the potential of the second node Q in the first shift register 40 to be stable, thereby avoiding that the display quality of the display panel is affected by the situation that the driving abilities of the first node P and the second node Q are mismatched due to too large potential difference between the first node P and the second node Q.

It is to be noted that the display device also includes a gate driver chip electrically connected to the first signal line S1, the second signal line S2 and the first shift register 40, and the gate driver chip is configured to provide a control timing signal to drive the gate of the array substrate through the shift register circuit. The first signal line S1 and the second signal line S2 are signal lines that can drive the first shift register 40 to output stably. The drive module 50 may be integrated inside the gate driver chip or partially integrated inside the gate driver chip, which is not limited in the embodiment of the present disclosure. In this way, the circuit wiring is simplified and the narrow bezel design of the display device is facilitated.

Optionally, the first node P is a pull-up node and the second node Q is a pull-down node.

It can be understood that when the first shift register 40 is in a normal working state, the first input signal s1 is provided by the first signal line S1 and the second input signal s2 is provided by the second signal line S2, so that the potential of the first node P can be raised to a high level, or the potential of the second node Q can be lowered to a low level, so that the first node P is the pull-up node and the second node Q is the pull-down node.

Exemplarily, when the drive module 50 detects that the potential of the first node P is getting higher and higher, and the potential of the second node Q is getting lower and lower, the drive module 50 may adjust at least one of the first input signal s1 and the second input signal s2 to lower the potential of the first node P and raise the potential of the second node Q, and the potential of the first node P and the potential of the second node Q are kept stable when the potential of the first node P and the potential of the second node Q return to normal, thereby ensuring the stable output of the first shift register 40 to improve the display effect of the display panel.

Figure 6:
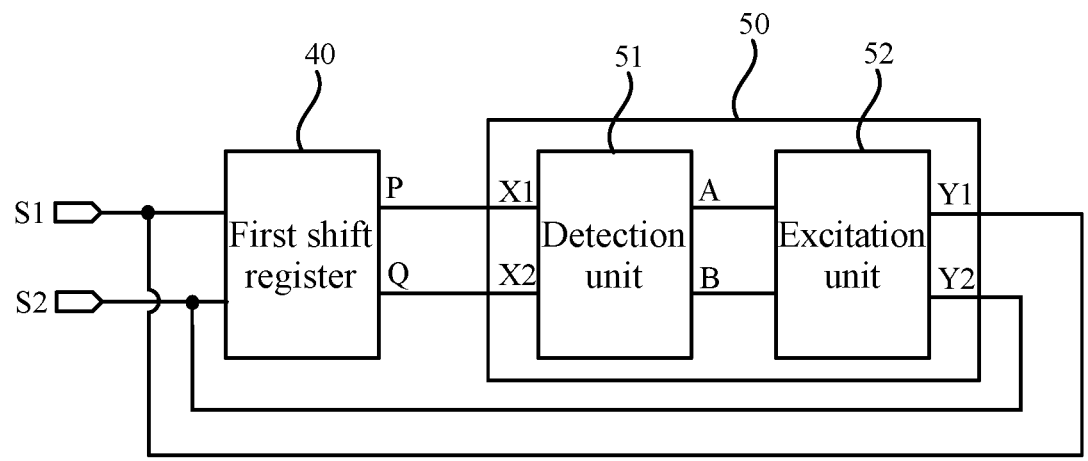
FIG. 6 is a structure diagram of another drive circuit provided by an embodiment of the present disclosure.

Optionally, FIG. 6 is a structure diagram of another drive circuit provided by an embodiment of the present disclosure. As shown in FIG. 6, the drive module 50 includes a detection unit 51 and an excitation unit 52. A first input terminal X1 of the detection unit 51 is electrically connected to the first node P, the second input terminal X2 of the detection unit 51 is electrically connected to the second node Q, a first detection terminal A of the detection unit 51 is electrically connected to the excitation unit 52, and a second detection terminal B of the detection unit 51 is electrically connected to the excitation unit 52. A first output terminal Y1 of the excitation unit 52 is electrically connected to the first signal line S1, and the second output terminal Y2 of the excitation unit 52 is electrically connected to the second signal line S2. The excitation unit 52 is configured to detect a potential of the first detection terminal A and a potential of the second detection terminal B so as to generate a potential detection result, and adjust at least one of the first input signal s1 and the second input signal s2.

The detection unit 51 is configured to detect the potential of the first node P and the potential of the second node Q in the first shift register 40, and output corresponding potential signals to the excitation unit 52 through the first detection terminal A and the second detection terminal B. The excitation unit 52 processes and analyses the detected potentials of the first detection terminal A and the second detection terminal B, and generates the potential detection result to adjust at least one of the first input signal s1 and the second input signal s2 so as to stabilize the first node P and the second node Q, thereby ensuring the stable output of the first shift register 40. As shown in FIG. 5, since other cascaded shift registers are electrically connected to the first signal line S1 and the second signal line S2, when at least one of the first input signal s1 and the second input signal s2 are adjusted, the stable output of the other cascaded shift registers can be improved and then the display quality can be improved.

It is to be noted that the excitation unit 52 may be integrated on the gate driver chip in the display device or may be arranged separately, which is not particularly limited in the embodiment of the present disclosure and may be set by those skilled in the art according to the actual situation.

Figure 7:
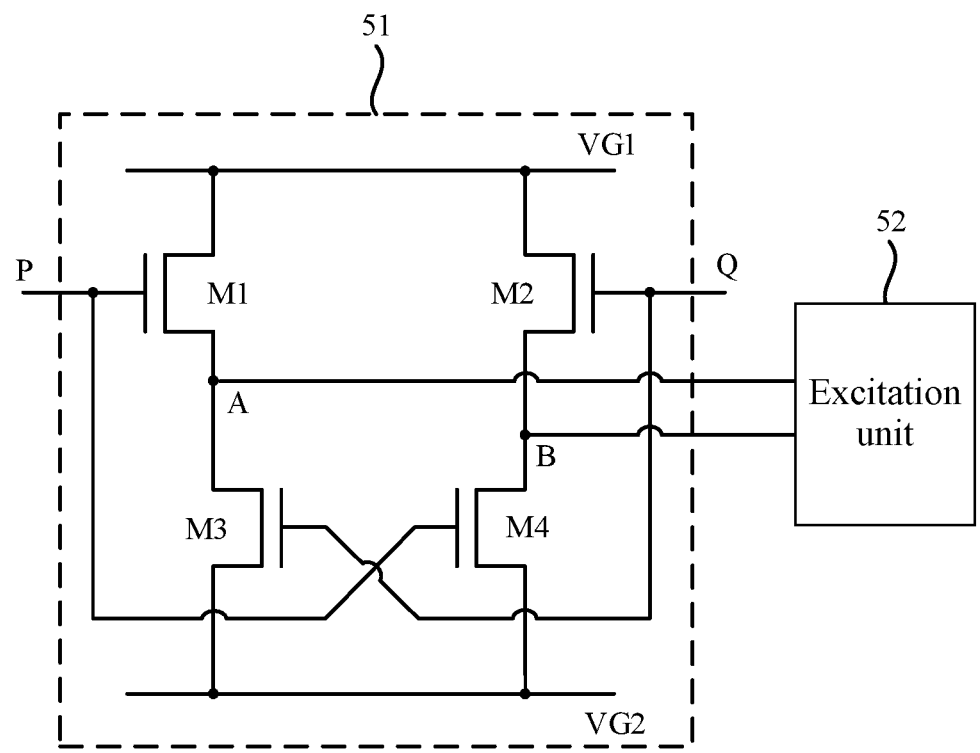
FIG. 7 is a circuit structure diagram of a detection unit of FIG. 6.

Optionally, FIG. 7 is a circuit structure diagram of a detection unit of FIG. 6. In conjunction with FIGS. 6 and 7, the detection unit 51 includes a first switching device M1, a second switching device M2, a third switching device M3 and a fourth switching device M4. The first switching device M1 is connected between a first power supply terminal VG1 and the first detection terminal A, and a control terminal of the first switching device M1 is electrically connected to the first node P. The second switching device M2 is connected between the first power supply terminal VG1 and the second detection terminal B, and a control terminal of the second switching device M2 is electrically connected to the second node Q. The third switching device M3 is connected between a second power supply terminal VG2 and the first detection terminal A, and a control terminal of the third switching device M3 is electrically connected to the second node Q. The fourth switching device M4 is connected between the second power supply terminal VG2 and the second detection terminal B, and a control terminal of the fourth switching device M4 is electrically connected to the first node P.

Since the control terminals of the first switching device M1 and the fourth switching device M4 are both electrically connected to the first node P, the first switching device M1 and the fourth switching device M4 are simultaneously turned on or off. Similarly, since the control terminals of the second switching device M2 and the third switching device M3 are both electrically connected to the second node Q, the first switching device M1 and the fourth switching device M4 are simultaneously turned on or off.

Exemplarily, in a case where the driving ability of the first node P is stronger than that of the second node Q, the first node P controls the first switching device M1 and the fourth switching device M4 to be turned on, and the driving ability of the second node Q is relatively weak, so that the second switching device M2 and the third switching device M3 are in an OFF state. In this case, the potential of the first detection terminal A is clamped to the first power supply terminal VG1, and the potential of the second detection terminal B is clamped to the second power supply terminal VG2. Therefore, the driving ability magnitudes of the first node P and the second node Q and the driving ability difference between the first node P and the second node Q may be obtained by detecting the potential of the first detection terminal A and the potential of the second detection terminal B.

Next, the excitation unit 52 processes and analyzes the detected potentials of the first detection terminal A and the second detection terminal B, and generates the potential detection result to adjust at least one of the first input signal s1 and the second input signal s2 so as to stabilize the first node P and the second node Q, thereby ensuring the stable output of the first shift register 40. As shown in FIG. 5, since other cascaded shift registers are electrically connected to the first signal line S1 and the second signal line S2, the stable output of the other cascaded shift registers can be improved and then the display quality can be improved when at least one of the first input signal s1 and the second input signal s2 are adjusted.

It is to be noted that in this embodiment, the excitation unit 52 may be integrated inside the gate driver chip in the display device so as to reduce the wiring layout and facilitate lightness, thinness and narrow bezel of the display device.

Optionally, referring to FIGS. 6 and 7, the first switching device M1, the second switching device M2, the third switching device M3 and the fourth switching device M4 each are an N-type MOS transistor, and a voltage of the first power supply terminal VG1 is greater than a voltage of the second power supply terminal VG2.

In a case where the first switching device M1, the second switching device M2, the third switching device M3 and the fourth switching device M4 each are the N-type MOS transistor, a control voltage for controlling the first switching device M1, the second switching device M2, the third switching device M3 and the fourth switching device M4 to be turned on is a high level, and a control voltage for controlling the first switching device M1, the second switching device M2, the third switching device M3 and the fourth switching device M4 to be turned off is a low level.

A voltage signal vg1 provided by the first power supply terminal VG1 may be a high level signal, and a voltage signal vg2 provided by the second power supply terminal VG2 may be a low level signal.

In a case where the driving ability of the first node P is stronger than that of the second node Q, that is, in a case where the first node P is a high level and the second node Q is a low level, the first node P controls the first switching device M1 and the fourth switching device M4 to be turned on and the second node Q controls the second switching device M2 and the third switching device M3 to be turned off. In this case, the potential of the first detection terminal A is clamped to the first power supply terminal VG1, and the potential of the second detection terminal B is clamped to the second power supply terminal VG2, so that the potential of the first detection terminal A is greater than the potential of the second detection terminal B.

In a case where the driving ability of the first node P is weaker than that of the second node Q, that is, in a case where the first node P is a low level and the second node Q is a high level, the first node P controls the first switching device M1 and the fourth switching device M4 to be turned off and the second node Q controls the second switching device M2 and the third switching device M3 to be turned on. In this case, the potential of the first detection terminal A is clamped to the second power supply terminal VG2, and the potential of the second detection terminal B is clamped to the first power supply terminal VG1, so that the potential of the first detection terminal A is less than the potential of the second detection terminal B.

Therefore, in this embodiment, the first switching device M1, the second switching device M2, the third switching device M3 and the fourth switching device M4 each are the N-type MOS transistors, and the voltage of the first power supply terminal VG1 is greater than the voltage of the second power supply terminal VG2, so that in a case where the driving ability of the first node P is stronger than that of the second node Q, the potential of the first detection terminal A is correspondingly greater than the potential of the second detection terminal B; and in a case where the driving ability of the second node Q is stronger than that of the first node P, the potential of the second detection terminal B is correspondingly greater than the potential of the first detection terminal A.

Based on this, in a case where the driving abilities of the first node P and the second node Q are mismatched, the excitation unit 52 can determine strengths of the driving abilities of the first node P and the second node Q by directly detecting the potentials of the first detection terminal A and the second detection terminal B and determining the magnitudes of the potentials of the first detection terminal A and the second detection terminal B, and adjust at least one of the first input signal s1 and the second input signal s2 according to the potential detection result, thereby quickly and accurately stabilizing the potentials of the first node P and the second node Q and ensuring the stable output of the first shift register 40. As shown in FIG. 5, since other cascaded shift registers are electrically connected to the first signal line S1 and the second signal line S2, when at least one of the first input signal s1 and the second input signal s2 are adjusted, the stable output of the other cascaded shift registers can be improved and then the display quality can be improved.

Optionally, referring to FIGS. 6 and 7, the excitation unit 52 is configured to adjust the first input signal s1 to reduce the potential difference between the first detection terminal A and the second detection terminal B when detecting that the potential of the first detection terminal A is greater than the potential of the second detection terminal B. The excitation unit 52 is further configured to adjust the second input signal s2 to reduce the potential difference between the first detection terminal A and the second detection terminal B when detecting that the potential of the first detection terminal A is less than the potential of the second detection terminal B.

The excitation unit 52 generates the potential detection result and adjusts the first input signal s1 when detecting that the potential of the first detection terminal A is greater than the potential of the second detection terminal B, so that the driving ability difference between the first node P and the second node Q is reduced, thereby reducing the potential difference between the first detection terminal A and the second detection terminal B. Similarly, the excitation unit 52 generates the potential detection result and adjusts the second input signal s2 when detecting that the potential of the first detection terminal A is less than the potential of the second detection terminal B, so that the driving ability difference between the first node P and the second node Q is reduced, thereby reducing the potential difference between the first detection terminal A and the second detection terminal B. In this case, the first input signal s1 and the second input signal s2 are adjusted to reduce the driving ability difference between the first node P and the second node Q, thereby ensuring the normal display of the next frame of display picture and improving the display quality of the display panel.

Figure 8:
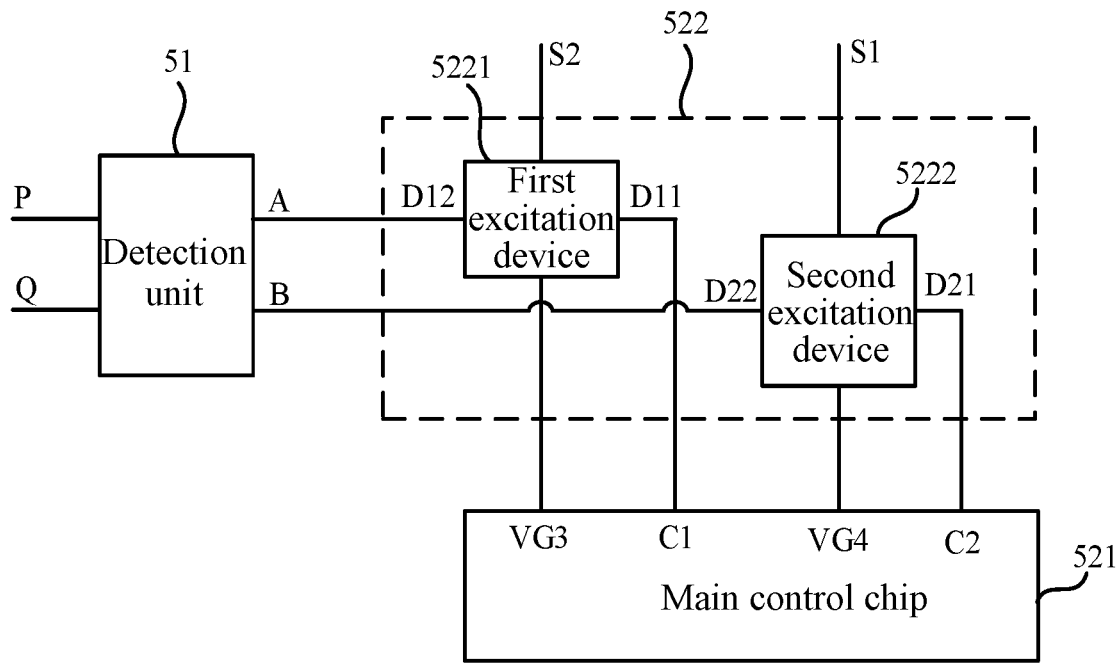
FIG. 8 is a circuit structure diagram of an excitation unit of FIG. 6.

Optionally, FIG. 8 is a circuit structure diagram of an excitation unit of FIG. 6. In conjunction with FIGS. 6 and 8, the excitation unit 52 includes a main control chip 521 and an excitation circuit 522, and the excitation circuit 522 includes a first excitation device 5221 and a second excitation device 5222. A first drive terminal D11 of the first excitation device 5221 is electrically connected to a first control terminal C1 of the main control chip 521, a second drive terminal D12 of the first excitation device 5221 is electrically connected to the first detection terminal A, an input terminal of the first excitation device 5221 is electrically connected to a third power supply terminal VG3 of the main control chip 521, and an output terminal of the first excitation device 5221 is electrically connected to the second signal line S2. A first drive terminal D21 of the second excitation device 5222 is electrically connected to a second control terminal C2 of the main control chip 521, a second drive terminal D22 of the second excitation device 5222 is electrically connected to the second detection terminal B, an input terminal of the second excitation device 5222 is electrically connected to a fourth power supply terminal VG4 of the main control chip 521, and an output terminal of the second excitation device 5222 is electrically connected to the first signal line S1.

In a display stage, the first drive terminal D11 of the first excitation device 5221 transmits a signal of the third power supply terminal VG3 to the second signal line S2 under the control of the main control chip 521, so that the second input signal s2 is transmitted by the second signal line S2 in the display stage. In the display blank stage, the first excitation device 5221 generates the detection result according to the detected potential of the first detection terminal A, and the second drive terminal D12 controls the first excitation device 5221 according to the detection result, so that the first excitation device 5221 outputs according to an input signal of the third power supply terminal VG3, and transmits an output signal to the second signal line S2 to adjust of the second input signal s2.

Similarly, in the display stage, the first drive terminal D21 of the second excitation device 5222 transmits a signal of the fourth power supply terminal VG4 to the first signal line S1 under the control of the main control chip 521, so that the first input signal s1 is transmitted by the first signal line S1 in the display stage. In the display blank stage, the second excitation device 5222 generates the detection result according to the detected potential of the second detection terminal B, and the second drive terminal D22 controls the second excitation device 5222 according to the detection result, so that the second excitation device 5222 outputs according to an input signal of the fourth power supply terminal VG4, and transmits an output signal to the first signal line S1 to adjust of the first input signal s1.

In the display stage, control signals of the first control terminal C1 and the second control terminal C2 are valid control signals, the first excitation device 5221 transmits the signal of the third power supply terminal VG3 to the second signal line S2, and the second excitation device 5222 transmits the signal of the fourth power supply terminal VG4 to the first signal line S1. In the display blank stage, the control signals are invalid control signals.

In the display blank stage, the first excitation device 5221 is controlled by the second drive terminal D12, and the second excitation device 5222 is controlled by the second drive terminal D22, so that the first excitation device 5221 or the second excitation device 5222 can adjust at least one of the second input signal s2 and the first input signal s1 through the output signal, thereby reducing the potential difference between the first detection terminal A and the second detection terminal B, so that the driving ability difference between the first node P and the second node Q is reduced.

It can be understood that voltage signals of the third power supply terminal VG3 and the fourth power supply terminal VG4 may be high level signals, or may also be low-level signals, which is not particularly limited in the embodiment of the present disclosure and can be selectively set according to the types of the first signal line S1 and the second signal line S2 as well as the influences of the first signal line S1 and the second signal line S2 on the driving abilities of the first node P and the second node Q. It is to be noted that the voltage signals of the third power supply terminal VG3 and the fourth power supply terminal VG4 in the display blank stage may be different from the voltage signals of the third power supply terminal VG3 and the fourth power supply terminal VG4 in the display stage. In the display blank stage, the voltage signals of the third power supply terminal VG3 and the fourth power supply terminal VG4 need to be adjusted according to the driving ability difference between the first node P and the second node Q so as to adjust of the first signal line S1 and the second signal line S2.

It is to be noted that the main control chip 521 may be integrated on the gate driver chip to simplify the wiring layout, which is not particularly limited in the embodiment of the present disclosure.

Figure 9:
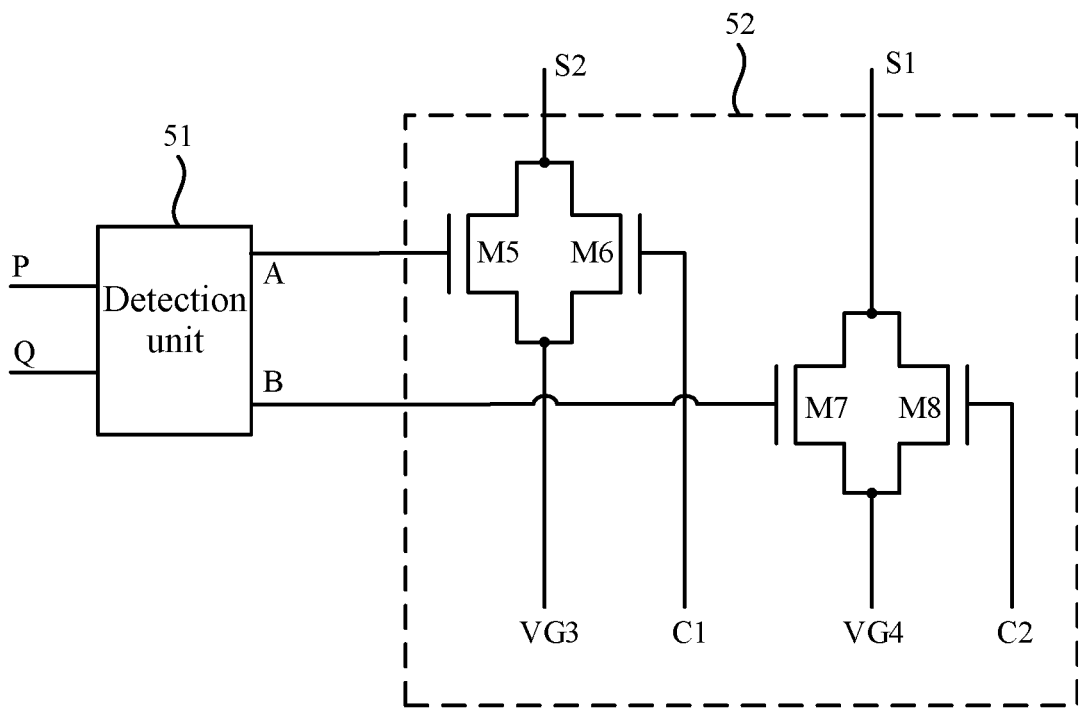
FIG. 9 is another circuit structure diagram of an excitation unit of FIG. 6.

Optionally, FIG. 9 is another circuit structure diagram of an excitation unit of FIG. 6. In conjunction with FIGS. 6 and 9, the excitation unit 52 includes a fifth switching device M5, a sixth switching device M6, a seventh switching device M7 and an eighth switching device M8. The fifth switching device M5 is connected between the third power supply terminal VG3 and the second signal line S2, and a control terminal of the fifth switching device M5 is electrically connected to the first detection terminal A. The sixth switching device M6 is connected between the third power supply terminal VG3 and the second signal line S2, and a control terminal of the sixth switching device M6 is electrically connected to the first control terminal C1. The seventh switching device M7 is connected between the fourth power supply terminal VG4 and the first signal line S1, and a control terminal of the seventh switching device M7 is electrically connected to the second detection terminal B. The eighth switching device M8 is connected between the fourth power supply terminal VG4 and the first signal line FW, and a control terminal of the eighth switching device M8 is electrically connected to the second control terminal C2.

Figure 10:
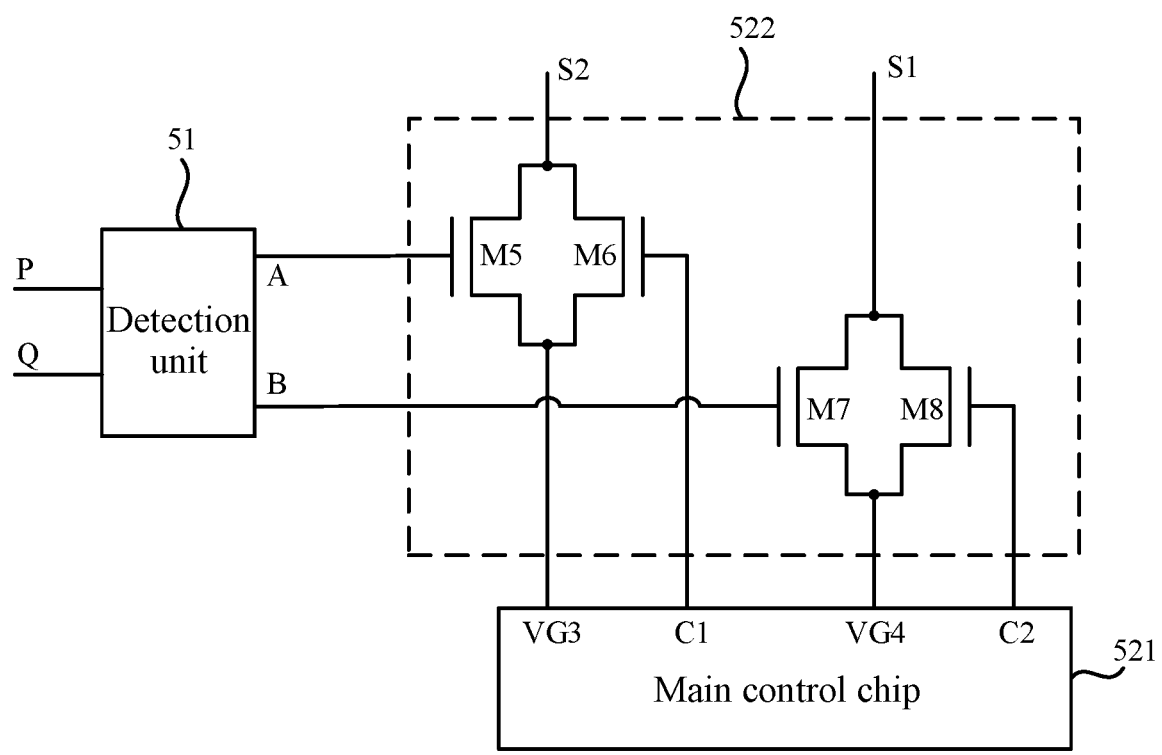
FIG. 10 is another circuit structure diagram of an excitation unit of FIG. 6.

It can be understood that FIG. 9 only exemplarily shows a circuit structure of the excitation unit 52, and a main control chip 521 and an excitation circuit 522 in the excitation unit 52 may be integrally designed, or the main control chip 521 and the excitation circuit 522 in the excitation unit 52 may be independently designed, as shown in FIG. 10.

The fifth switching device M5 and the sixth switching device M6 are connected in parallel, and the seventh switching device M7 and the eighth switching device M8 are connected in parallel. In this way, when either the fifth switching device M5 or the sixth switching device M6 is in an ON state, a power supply signal vg3 provided by the third power supply terminal VG3 can be transmitted to the second signal line S2. Similarly, when either the seventh switching device M7 or the eighth switching device M8 is in the ON state, a power supply signal vg4 provided by the fourth power supply terminal VG4 can be transmitted to the first signal line S1.

Further, in the display blank stage, control signals of the first control terminal C1 and the second control terminal C2 are invalid control signals, and the sixth switching device M6 and the eighth switching device M8 are turned off. In this way, the excitation unit 52 controls turn-on or turn-off of the fifth switching device M5 and the seventh switching device M7 through the magnitudes of the detected potentials of the first detection terminal A and the second detection terminal B, thereby effectively adjusting at least one of the second input signal s2 and the first input signal s1 to reduce the driving ability difference between the first node P and the second node Q while reducing the potential difference between the first detection terminal A and the second detection terminal B and improving the display quality.

Optionally, the fifth switching device M5, the sixth switching device M6, the seventh switching device M7 and the eighth switching device M8 each are an N-type MOS transistor; and each of the third power supply terminal VG3 and the fourth power supply terminal VG4 is a high potential.

Specifically, in a case where the fifth switching device M5, the sixth switching device M6, the seventh switching device M7 and the eighth switching device M8 each are the N-type MOS transistor, a control voltage for controlling the fifth switching device M5, the sixth switching device M6, the seventh switching device M7 and the eighth switching device M8 to be turned on is a high level, and a control voltage for controlling the fifth switching device M5, the sixth switching device M6, the seventh switching device M7 and the eighth switching device M8 to be turned off is a low level. Based on this, in the display stage, valid control signals of the first control terminal C1 and the second control terminal C2 are a high level, and in the display blank stage, invalid control signals of the first control terminal C1 and the second control terminal C2 are a low level.

In the display stage, the control signals of the first control terminal C1 and the second control terminal C2 are a high level, the sixth switching device M6 and the eighth switching device M8 are both turned on, the first signal line S1 receives the power supply signal vg4 provided by the fourth power supply terminal VG4, and the second signal line S2 receives the power supply signal vg3 provided by the third power supply terminal VG3, so that the first input signal s1 and the second input signal s2 are a high level.

In the display blank stage, the control signals of the first control terminal C1 and the second control terminal C2 are a low level, and the sixth switching device M6 and the eighth switching device M8 are both turned off. In a case where the potential of the first detection terminal A or the second detection terminal B is detected to be a high level, the first detection terminal A controls the fifth switching device M5 to be turned on, and the second signal line S2 receives the power supply signal vg3 provided by the third power supply terminal VG3; or the second detection terminal B controls the seventh switching device M7 to be turned on, and the first signal line S1 receives the power supply signal vg4 provided by the fourth power supply terminal VG4. In a case where the potential of the first detection terminal A or the second detection terminal B is detected to be a low level, the first detection terminal A controls the fifth switch tube M5 to be turned off, the second signal line S2 cannot receive the power supply signal vg3 provided by the third power supply terminal VG3, and the potential of the second input signal s2 is pulled down; or the second detection terminal B controls the seventh switching device M7 to be turned off, the first signal line S1 cannot receive the power supply signal vg4 provided by the fourth power supply terminal VG4, and the potential of the first input signal s1 is pulled down.

Optionally, a working process of the drive circuit within one frame of display picture includes a potential detection stage for detecting the potential of the first node and the potential of the second node, and other stages except the potential detection stage, where the first control terminal C1 and the second control terminal C2 are a low potential in the potential detection stage, and the first control terminal C1 and the second control terminal C2 are a high potential in the other stages.

The time for displaying one frame of picture on the display screen is one scanning period, and one scanning period includes a display stage Display and a display blank stage Blanking. The potential detection stage in which the potential of the first node P and the second node Q are detected may be the display blank stage Blanking in one scanning period or may be within the display blank stage Blanking, to avoid affecting the display quality of the display screen in the display stage when at least one of the first input signal s1 and the second input signal s2 are adjusted according to the potential detection result of the first node P and the second node Q. Other stages except the potential detection stage may include a display stage Display, or a display stage Display and part of a display blank stage Blanking, which are not particularly limited in the embodiment of the present disclosure.

In conjunction with FIG. 9, in the potential detection stage, the first control terminal C1 and the second control terminal C2 are a low potential, the sixth switching device M6 and the eighth switching device M8 are turned off, and the excitation unit 52 controls turn-on or turn-off of at least one of the fifth switching device M5 and the seventh switching device M7 through at least one of the detected potential of the first detection terminal A and the detected potential of the second detection terminal B, thereby effectively adjusting at least one of the second input signal s2 and the first input signal s1.

In the display stage, the first control terminal C1 and the second control terminal C2 are a high potential, the sixth switching device M6 and the eighth switching device M8 are both turned on, the first signal line S1 receives the power supply signal vg4 provided by the fourth power supply terminal VG4, and the second signal line S2 receives the power supply signal vg3 provided by the third power supply terminal VG3, so that the first input signal s1 and the second input signal s2 are both a high potential.

Figure 11:
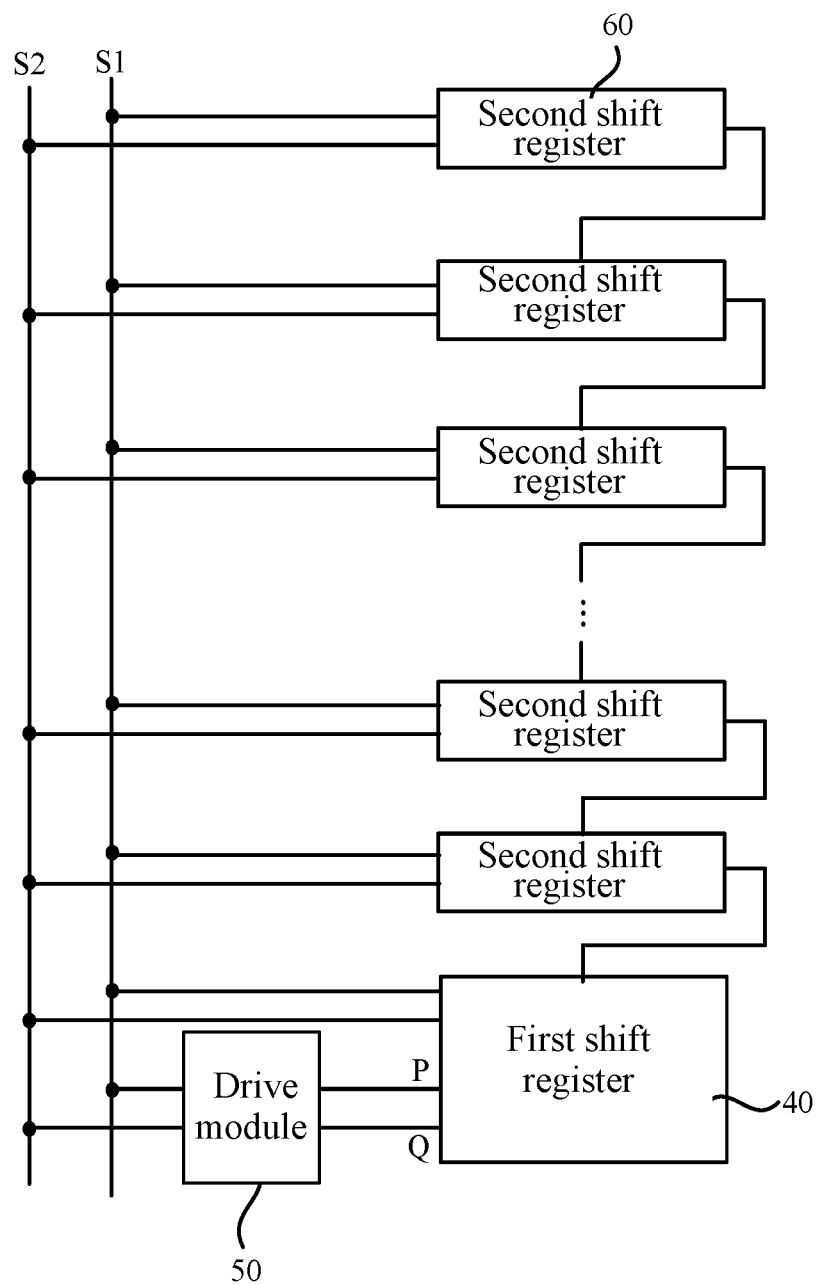
FIG. 11 is a structure diagram of another drive circuit provided by an embodiment of the present disclosure.

Optionally, FIG. 11 is a structure diagram of another drive circuit provided by an embodiment of the present disclosure. The drive circuit includes multiple cascaded second shift registers 60, and a shift register output terminal of a triggered last-stage second shift register is electrically connected to a shift trigger input terminal of the first shift register 40.

In conjunction with FIGS. 5 and 11, the first shift register 40 may be located at a lower-stage of the last-stage second shift register 60; in this way, the shift register output terminal of the triggered last-stage second shift register 60 is also electrically connected to a shift trigger input terminal of a lower-stage first shift register 40 while the shift register output terminal of the triggered last-stage second shift register 60 is electrically connected to a corresponding scanning signal line (not shown in the figure), so that a signal output from the shift register output terminal of the second shift register 60 is transmitted to the shift trigger input terminal of the first shift register 40 and served as an input signal of the first shift register 40 to control the working of the first shift register 40. Moreover, input signals of the first signal line S1 and the second signal line S2 are adjusted by the drive module 50 detecting the first node P and the second node Q in the first shift register 40, so as to reduce the driving ability difference between the first node P and the second node Q, thereby ensuring the potential stability of the first node P and the second node Q, and improving the display quality.

In other embodiments, optionally, the first shift register may be located at an upper-stage of the first-stage second shift register.

Figure 12:
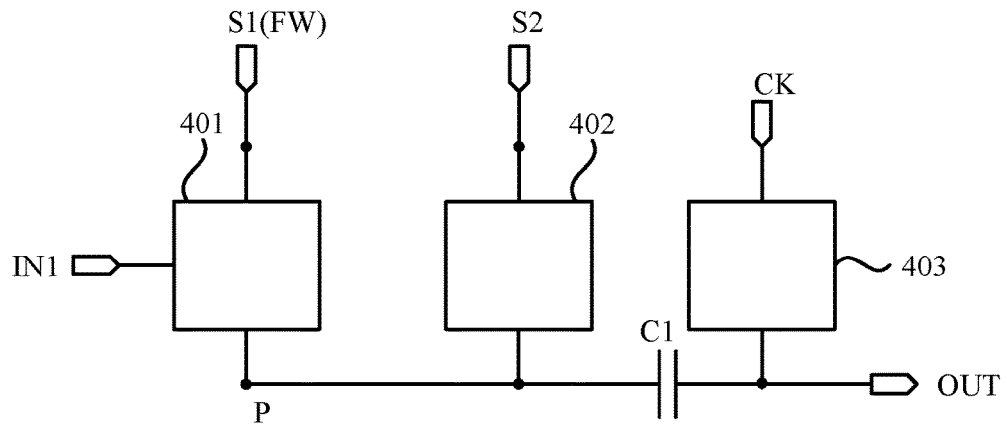
FIG. 12 is a structure diagram of a first shift register provided by an embodiment of the present disclosure.

Optionally, FIG. 12 is a structure diagram of a first shift register provided by an embodiment of the present disclosure. The first shift register 40 includes an input module 401, a voltage dividing module 402, and an output module 403. An output terminal of the input module 401 is electrically connected to the first node P, the output module 403 is coupled with the first node P through a coupling capacitor C1, a control terminal of the voltage dividing module 402 is connected to the first node P, and the voltage dividing module 401 includes the second node Q. The input module 401 is configured to adjust the potential of the first node P, and the voltage dividing module 402 is configured to adjust the potential of the second node Q.

Optionally, as shown in FIG. 12, the input terminal of the input module 401 is electrically connected to the first signal line S1, and the first input terminal of the voltage dividing module 402 is electrically connected to the second signal line S2. The drive module 50 is configured to pull down the first input signal s1 or the second input signal s2 according to the potential detection result.

Figure 13:
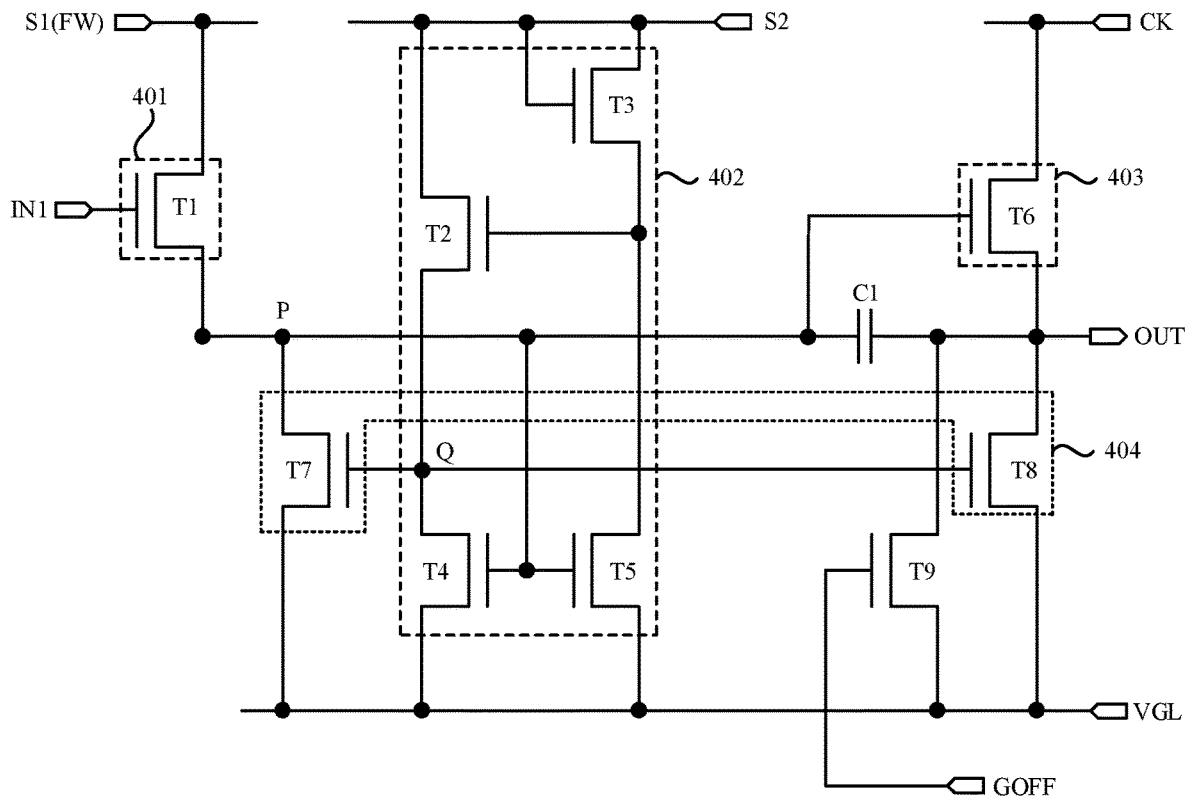
FIG. 13 is a circuit structure diagram of a first shift register of FIG. 12.

It can be understood that FIG. 13 is a circuit structure diagram of a first shift register of FIG. 12. FIG. 13 exemplarily shows that the input module 401 includes a first transistor T1. A control terminal of the first transistor T1 is connected to a shift trigger input terminal IN1 of the first shift register 40. The shift trigger input terminal IN1 is electrically connected to a shift register output terminal of the upper-stage second shift register 60 (not shown in the figure). The first transistor T1 is electrically connected between the first signal line S1 and the first node P, and the input module 401 is configured to transmit the first input signal s1 from the first signal line S1 to the first node P under the control of an input signal of the input terminal IN1. The voltage dividing module 402 includes a second transistor T2, a third transistor T3, a fourth transistor T4, and a fifth transistor T5, and a first pole of the second transistor T2, a gate of the third transistor T3, and a first pole of the third transistor T3 are all electrically connected to the first signal line S1. A second pole of the second transistor T2 is electrically connected to the second node Q, gates of the fourth transistor T4 and the fifth transistor T5 are both electrically connected to the first node P, the fourth transistor T4 is electrically connected between the second node Q and the first level signal terminal VGL, and the fifth transistor T5 is electrically connected between a second pole of the third transistor T3 and the first level signal terminal VGL. The coupling capacitor C1 is electrically connected between the second node P and the signal output terminal OUT, and a storage capacitor C1 is capable of storing potentials of the second node P and the signal output terminal OUT. The output module 403 includes a sixth transistor T6, a gate of the sixth transistor T6 is electrically connected to the first node P, a first pole of the sixth transistor T6 is electrically connected to a clock signal terminal CK, and a second pole of the sixth transistor T6 is electrically connected to the signal output terminal OUT. The output module 403 is configured to transmit a clock signal Ck from the clock signal terminal CK to the signal output terminal OUT under the control of the potential of the first node P.

Moreover, the first shift register 40 may further include a pull-down module 404, a ninth transistor T9 and a shut-down signal terminal GOFF. The pull-down module 404 includes a seventh transistor T7 and an eighth transistor T8, and the pull-down module 404 is configured to transmit the first level signal Vg1 of the first level signal terminal VGL to the first node P and the signal output terminal OUT under the control of the potential of the second node Q. A channel type of the seventh transistor T7 is same as that of the eighth transistor T8, that is, the signal capable of controlling the seventh transistor T7 to be turned on is also capable of controlling the eighth transistor T8 to be turned on, and the signal capable of controlling the seventh transistor T7 to be turned off is also capable of controlling the eighth transistor T8 to be turned off. The ninth transistor T9 is electrically connected between the signal output terminal OUT and the first level signal terminal VGL, a gate of the ninth transistor T9 is electrically connected to the shut-down signal terminal GOFF, and a shut-down signal Goff provided by the shut-down signal terminal GOFF may control the output signal terminal OUT to output the first level signal Vg1 in a case where the ninth transistor T9 is turned on, so as to prevent other signals from interfering the output of the first register 40.

Figure 14:
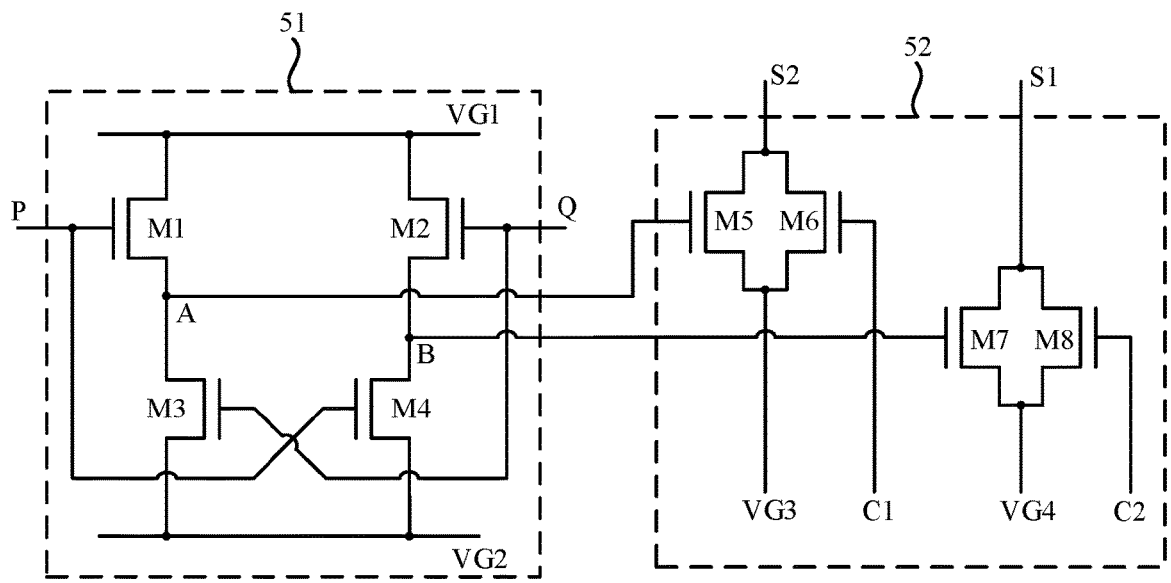
FIG. 14 is a structure diagram of another drive circuit provided by an embodiment of the present disclosure.
Figure 15:
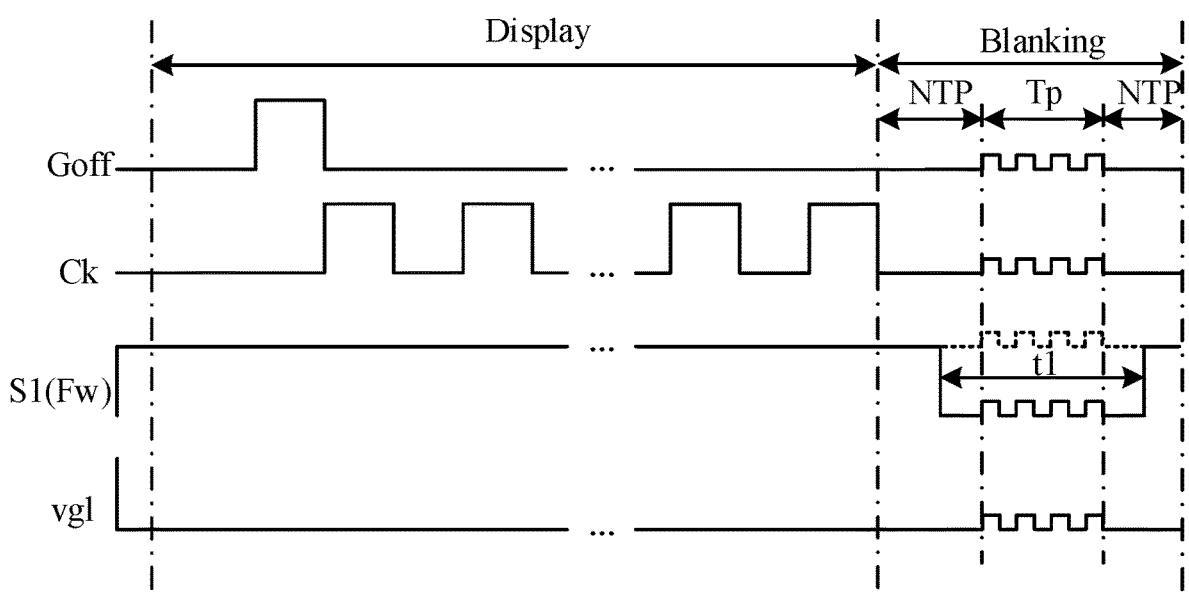
FIG. 15 is a driving timing diagram of a first shift register circuit provided by an embodiment of the present disclosure.

Exemplarily, FIG. 14 is a structure diagram of another drive circuit provided by an embodiment of the present disclosure. FIG. 15 is a driving timing diagram of a first shift register circuit provided by an embodiment of the present disclosure. In conjunction with FIGS. 13, 14 and 15, an input terminal of an input module 401 electrically connected to a first signal line S1 is a scanning control terminal FW, input signals provided by the first signal line S1 and a second signal line S2 in a display stage are a high level signal, and a first level signal terminal VGL provides a low level signal. In a case where the driving ability of the first node P is stronger than that of the second node Q, it can be considered that the potential of the first node P is higher than the potential of the second node Q; in this case, in a potential detection stage t1 (for example, in the display blank stage Blanking) in which the potentials of the first node P and the second node Q are detected, a detection unit 51 in the drive module 50 detects that the first switching device M1 and the fourth switching device M4 are turned on under the control of the potential of the first node P and the second switching device M2 and the third switching device M3 are turned off under the control of the potential of the second node Q, and then the potential of the first detection terminal A is clamped to the first power supply terminal VG1 (a high level), and the potential of the second detection terminal B is clamped to the second power supply terminal VG2 (a low level). In this way, the fifth switching device M5 in the excitation unit 52 is turned on under the control of the potential of the first detection terminal A, and the seventh switching device M7 is turned off under the control of the potential of the second detection terminal B.

Since the first control terminal C1 and the second control terminal C2 are a low potential in the potential detection stage t1, the sixth switching device M6 and the eighth switching device M8 are both turned off, and the third power supply terminal VG3 continues to provide a high level signal to the second input signal s2 of the second signal line S2 through the fifth switching device M5. However, since the seventh switching device M7 and the eighth switching device M8 are both turned off, the fourth power supply terminal VG4 cannot continue to provide a high level signal for the first input signal s1 of the first signal line S1, so that the first input signal s1 begins to be powered down gradually, and the potential of the first input signal s1 is pulled down, that is, a scanning control signal Fw of the scanning control terminal FW is pulled down (see the solid line part in the Blanking in FIG. 15, and the dotted line part denotes the case where Fw is not pulled down in the existing art); and then the driving ability of the first node P is gradually reduced by the input module 401, so that the driving ability difference between the first node P and the second node Q is reduced, thereby avoiding affecting the display effect of the next frame of display picture, and improving the display quality.

Based on the same principle, in a case where the driving ability of the second node Q is stronger than the driving ability of the first node P, the driving ability of the second node Q may be reduced by pulling down the second input signal s2 of the second signal line S2, so that the driving ability difference between the first node P and the second node Q is reduced, thereby avoiding affecting the display effect of the next frame of display picture, and improving the display quality.

It can be understood that, referring to FIG. 15, the display blank stage Blanking includes a touch stage TP and a non-touch stage NTP. In the touch stage TP, the touch signal is usually a pulse signal having a relatively small amplitude, and the amplitude of the pulse signal is less than an amplitude of a high potential signal of the third power supply terminal VG3 or the fourth power supply terminal VG4 so as to avoid affecting the adjustment of the first input signal s1.

Figure 16:
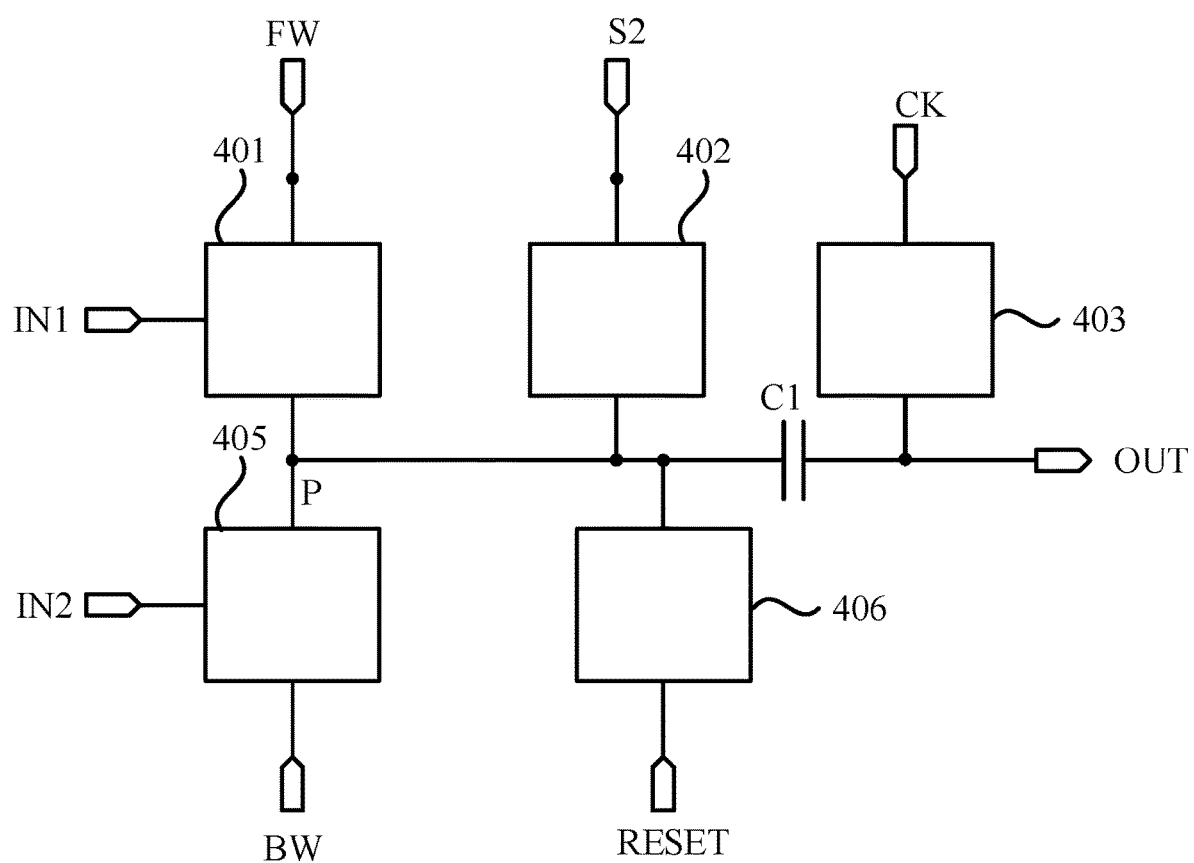
FIG. 16 is a structure diagram of another first shift register provided by an embodiment of the present disclosure.

Optionally, FIG. 16 is a structure diagram of another first shift register provided by an embodiment of the present disclosure. As shown in FIG. 16, the first shift register 40 includes a shut-down module 405 and a reset module 406. An output terminal of the shut-down module 405 is electrically connected to the first node P and the shut-down module 405 is configured to reduce the potential of the first node P. An output terminal of the reset module 406 is electrically connected to the first node P and the reset module 406 is configured to reset the first node P.

Figure 17:
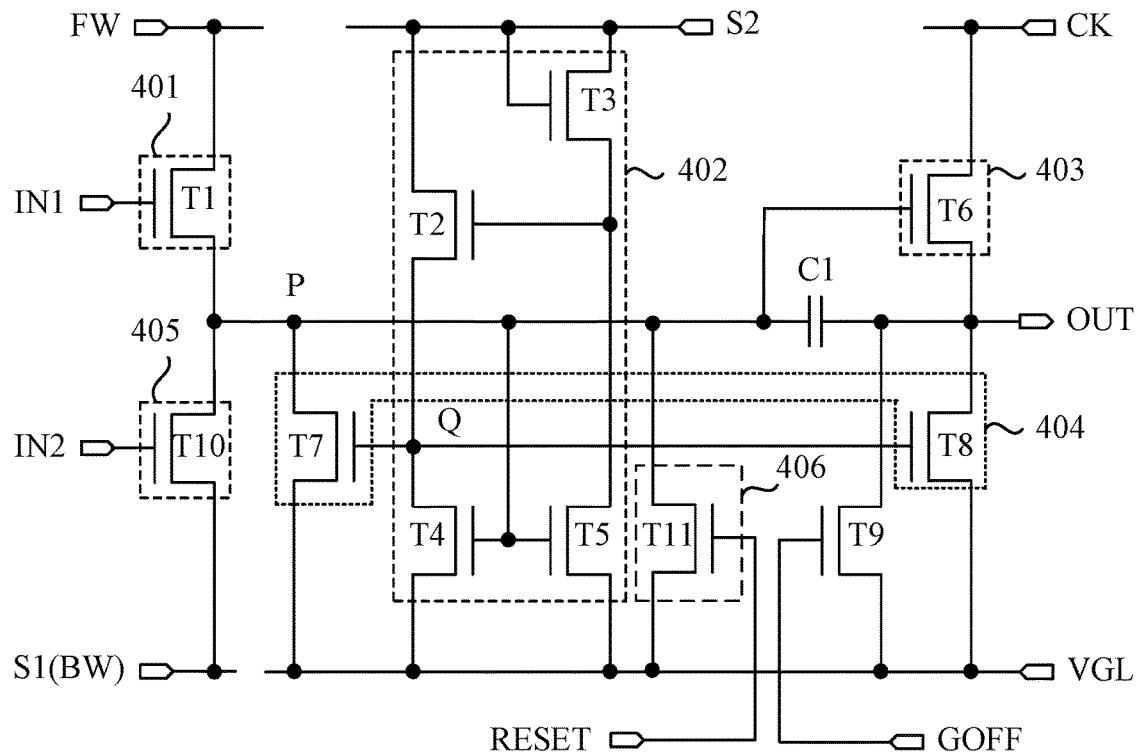
FIG. 17 is a circuit structure diagram of a first shift register of FIG. 16.

Optionally, FIG. 17 is a circuit structure diagram of a first shift register of FIG. 16. In conjunction with FIGS. 16 and 17, an input terminal of the shut-down module 405 is electrically connected to the first signal line S1, and the first input terminal of the voltage dividing module 402 is electrically connected to the second signal line S2. The drive module 50 is configured to pull down the first input signal s1 or the second input signal s2 according to the potential detection result.

It can be understood that, on the basis of FIG. 13, FIG. 17 exemplarily shows that the shut-down module 405 includes a tenth transistor T10. The tenth transistor T10 is electrically connected between the first node P and the first signal line S1. A control terminal of the tenth transistor T10 is connected to another shift trigger input terminal IN2 of the first shift register 40. The shift trigger input terminal IN2 is electrically connected to a shift register output terminal of a lower-stage second shift register 60 (not shown in the figure), and the shut-down module 405 is configured to transmit the first input signal s1 from the first signal line S1 to the first node P under the control of the input signal of the input terminal IN2. The reset module 406 includes an eleventh transistor T11. The eleventh transistor T11 is electrically connected between the first node P and the first level signal terminal VGL, and a control terminal of the eleventh transistor T11 is electrically connected to a reset signal terminal RESET. In a case where a reset signal Reset provided by the reset signal terminal RESET is a high level in order to control the eleventh transistor T11 to be turned on, the first level signal vg1 provided by the first level signal terminal VGL can be transmitted to the first node P.

Figure 18:
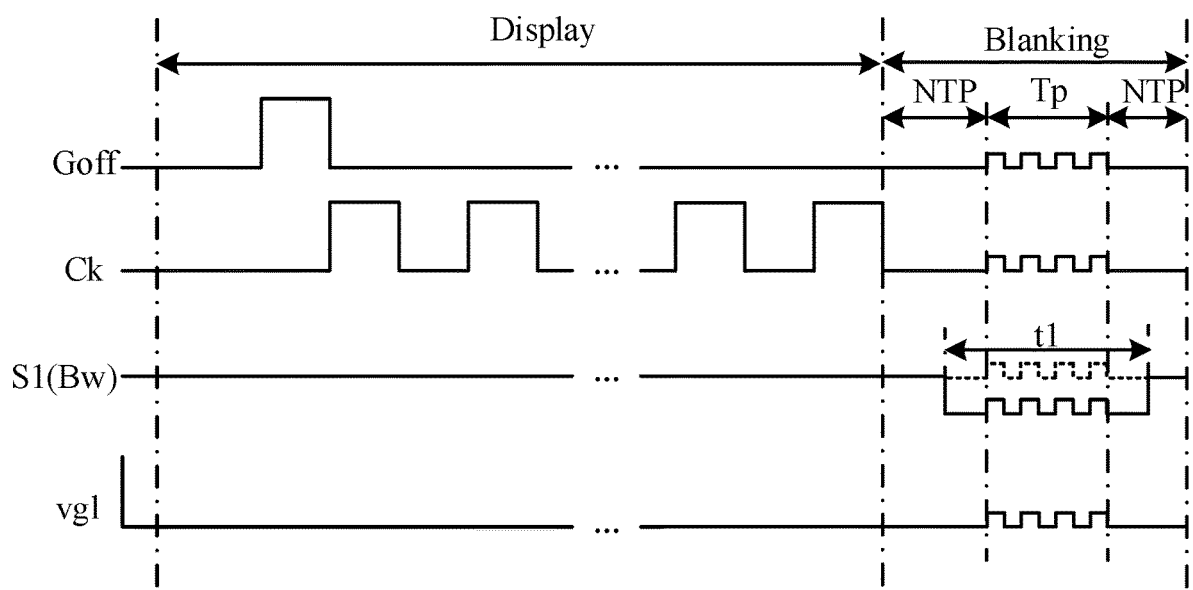
FIG. 18 is a driving timing diagram of another first shift register circuit provided by an embodiment of the present disclosure.

Exemplarily, FIG. 18 is a driving timing diagram of another first shift register circuit provided by an embodiment of the present disclosure. In conjunction with FIGS. 14, 17 and 18, the input terminal of the shut-down module 405 electrically connected to the first signal line S1 is the scanning control terminal BW; in this way, in a case where the driving ability of the first node P is stronger than that of the second node Q, the driving ability of the first node P can be reduced by pulling down the scanning control signal Bw of the scanning control terminal BW in the display blank stage Blanking, and the specific process will not be described here. Similarly, in a case where the driving ability of the second node Q is stronger than the driving ability of the first node P, the driving ability of the second node Q may be reduced by pulling down the second input signal s2 of the second signal line S2, so that the driving ability difference between the first node P and the second node Q is reduced, thereby avoiding affecting the display effect of the next frame of display picture, and improving the display quality.

Figure 19:
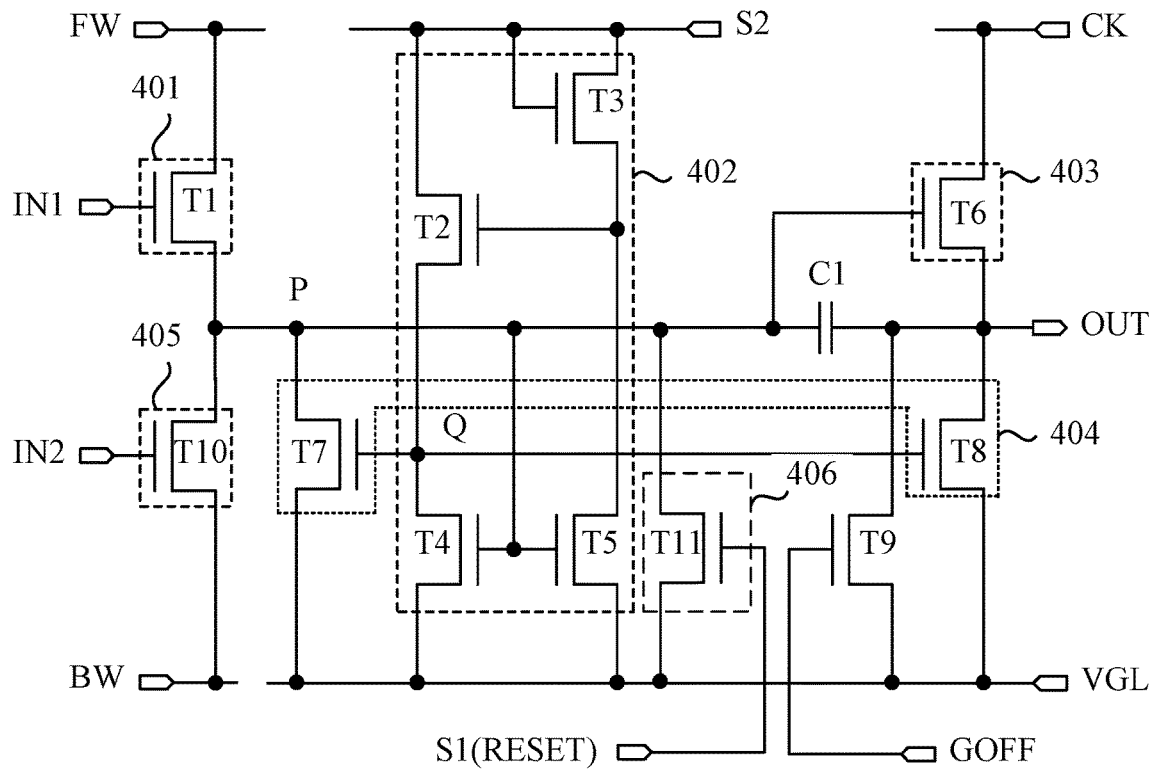
FIG. 19 is a circuit structure diagram of another first shift register of FIG. 16.

Optionally, FIG. 19 is a circuit structure diagram of another first shift register of FIG. 16. In conjunction with FIGS. 16 and 19, a control terminal of the reset module 406 is electrically connected to the first signal line S1, and the first input terminal of the voltage dividing module 402 is electrically connected to the second signal line S2. The drive module 50 is configured to pull up the first input signal s1 or pull down the second input signal s2 according to the potential detection result.

Figure 20:
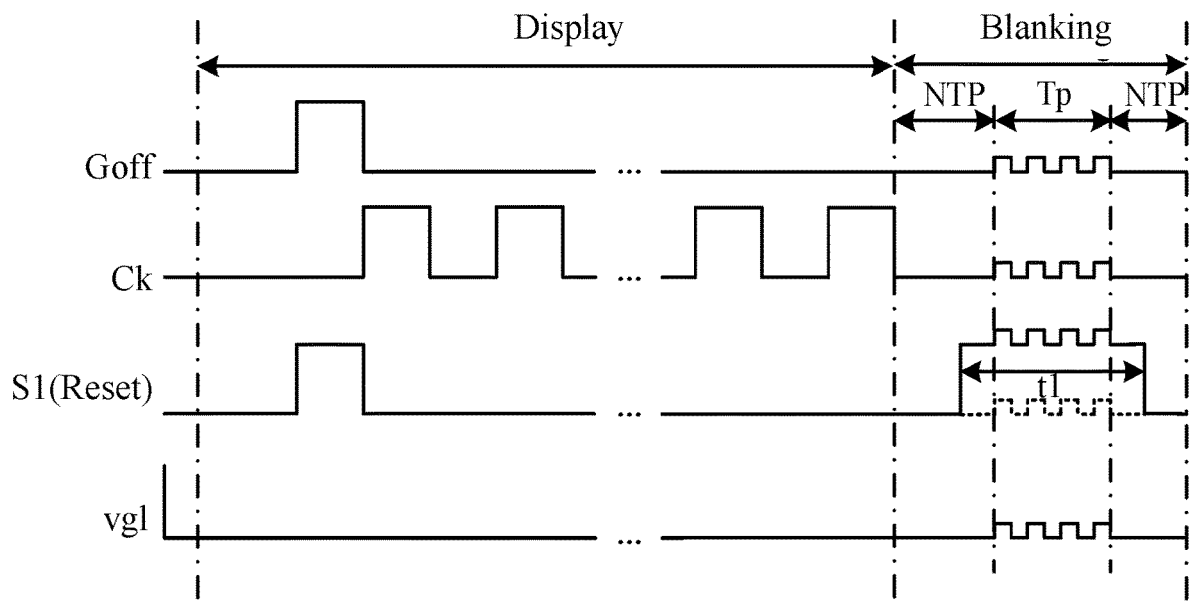
FIG. 20 is a driving timing diagram of another first shift register provided by an embodiment of the present disclosure.

Exemplarily, FIG. 20 is a driving timing diagram of another first shift register circuit provided by an embodiment of the present disclosure. In conjunction with FIGS. 14, 18 and 20, the control terminal of the reset module 406 electrically connected to the first signal line S1 is a reset signal terminal RESET, so that in a case where the driving ability of the first node P is stronger than that of the second node Q, the driving ability of the first node P may be reduced by pulling up a reset signal Reset of the reset signal terminal RESET in the display blank stage Blanking, and the specific process will not be described here. Similarly, in a case where the driving ability of the second node Q is stronger than the driving ability of the first node P, the driving ability of the second node Q may be reduced by pulling down the second input signal s2 of the second signal line S2, so that the driving ability difference between the first node P and the second node Q is reduced, thereby avoiding affecting the display effect of the next frame of display picture, and improving the display quality.

Optionally, within one frame of display picture, a working process of the drive circuit includes at least: a display stage Display, a display blank stage Blanking, and a potential detection stage t1 for detecting the potential of the first node and the potential of the second node; and part of a time period of the display blank stage Blanking overlaps a time period of the potential detection stage t1.

Referring to FIGS. 15, 18 and 20, in the display stage Display, an output terminal of each shift register corresponds to and is electrically connected to a respective one of scanning signal lines, and the shift register unit transmits a scanning signal output by the output terminal to the scanning line, so that the display panel displays the picture. In display blank stage Blanking, since the signal of the signal line in the shift register is affected by the leakage current of the transistor, the potential of the node associated with the shift register is drifted, especially in a high temperature and/or high humidity environment. Therefore, in the display blank stage Blanking, the potential of the first node P and the potential of the second node Q are detected, and at least one of the first input signal s1 and the second input signal s2 are adjusted to stabilize the potential of the first node P and the potential of the second node Q, thereby reducing the driving ability difference between the first node P and the second node Q, and improving the display quality of the next frame of display picture. Further, part of the time period in the display blank stage Blanking is configured to overlap with the time period of the potential detection stage t1 to avoid affecting the display quality of the display screen when at least one of the first input signal s1 and the second input signal s2 are adjusted according to the potential detection result of the first node P and the second node Q.

Optionally, the time period of the display blank stage Blanking overlaps the time period of the potential detection stage t1.

Figure 21:
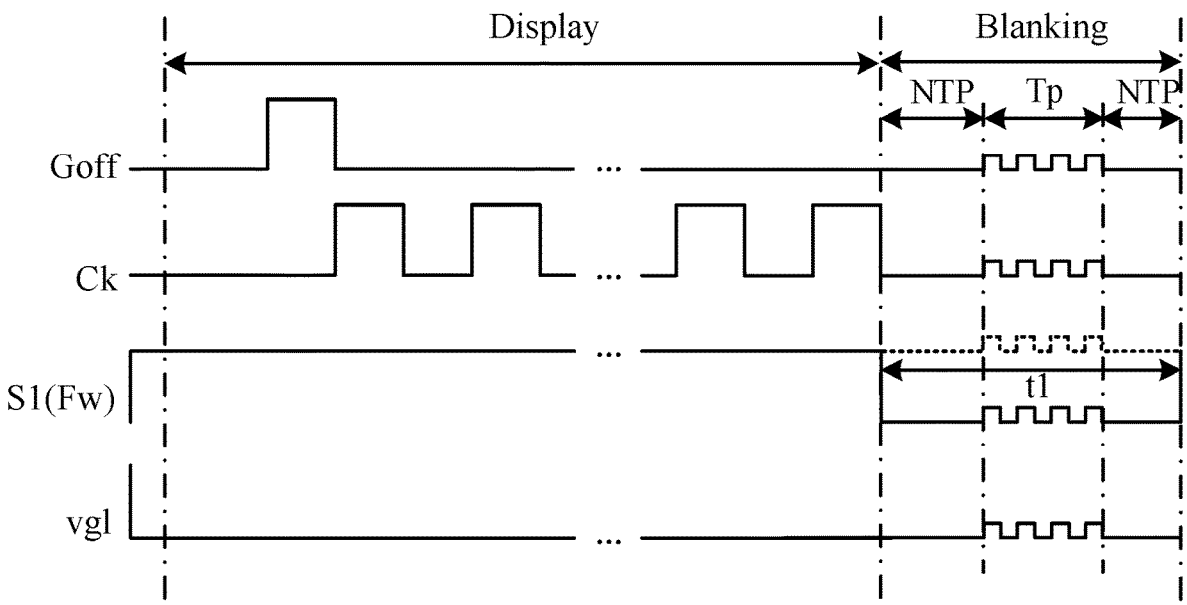
FIG. 21 is a driving timing diagram of another first shift register provided by an embodiment of the present disclosure.

Exemplarily, a case where the first signal line 51 is connected to the scanning control terminal FW of the input module 401 is used as an example, as shown in FIG. 21, FIG. 21 is a driving timing diagram of another first shift register provided by an embodiment of the present disclosure, the potential detection stage t1 may be provided in the whole display blank stage Blanking; in a case where the driving ability of the first node P is stronger than that of the second node Q, the scanning control signal Fw of the scanning control terminal FW is pulled down to reduce the driving ability difference between the first node P and the second node Q, and moreover, the potentials of the first node P and the second node Q are ensured to be stable in the whole display blank stage Blanking so as to improve the display quality of the display device.

Optionally, within one frame of display picture, the working process of the drive circuit includes multiple potential detection stages t1; and at least part of the time period of the display blank stage Blanking overlaps time periods of the multiple potential detection stages t1.

Figure 22:
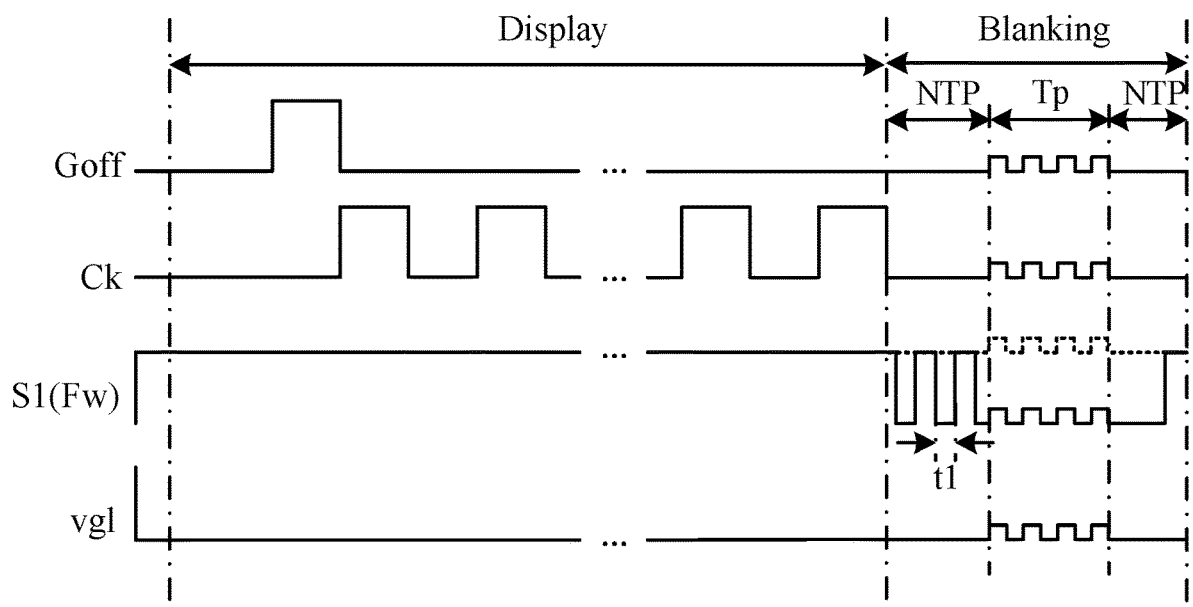
FIG. 22 is a driving timing diagram of another first shift register provided by an embodiment of the present disclosure.

Exemplarily, a case where the first signal line S1 is connected to the scanning control terminal FW of the input module 401 is used as an example, as shown in FIG. 22, FIG. 22 is a driving timing diagram of another first shift register provided by an embodiment of the present disclosure, the multiple potential detection stages t1 may be provided in the whole display blank stage Blanking; in a case where the driving ability of the first node P is stronger than that of the second node Q, the scanning control signal Fw of the scanning control terminal FW is pulled down to reduce the driving ability difference between the first node P and the second node Q, and moreover, the potentials of the first node P and the second node Q are ensured to be stable in the whole display blank stage Blanking so as to improve the display quality of the display device.

It is to be noted that the time length of each potential detection stage t1 may be same or different, which is not limited in this embodiment and can be selectively set according to the actual situation.

Based on the same inventive concept, an embodiment of the present disclosure also provides a structure diagram of a display device. The display device includes the preceding display panel.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A drive circuit, comprising:
    a first shift register, a first signal line and a second signal line, wherein the first shift register comprises a first node and a second node, the first signal line is configured to provide a first input signal for the first shift register, the second signal line is configured to provide a second input signal for the first shift register, and the first shift register is configured to control a potential of the first node and a potential of the second node according to the first input signal and the second input signal; and
    a drive module separated from the first shift register, wherein the drive module electrically is connected to the first node, the second node, the first signal line and the second signal line, wherein the drive module is configured to detect the potential of the first node and the potential of the second node, and adjust at least one of the first input signal or the second input signal according to the detected potential of the first node and the detected potential of the second node in order to reduce a potential difference between the potential of the first node and the potential of the second node.

2. The drive circuit of claim 1, wherein the first node is a pull-up node and the second node is a pull-down node.

3. The drive circuit of claim 1, wherein the drive module comprises a detection unit and an excitation unit;
    a first input terminal of the detection unit is electrically connected to the first node, the second input terminal of the detection unit is electrically connected to the second node, a first detection terminal of the detection unit is electrically connected to the excitation unit, and a second detection terminal of the detection unit is electrically connected to the excitation unit;
    a first output terminal of the excitation unit is electrically connected to the first signal line, and the second output terminal of the excitation unit is electrically connected to the second signal line; and
    the excitation unit is configured to detect a potential of the first detection terminal and a potential of the second detection terminal so as to generate the detected potential of the first detection terminal and the detected potential of the second detection terminal and adjust at least one of the first input signal or the second input signal.

4. The drive circuit of claim 3, wherein the detection unit comprises a first switching device, a second switching device, a third switching device and a fourth switching device;
    the first switching device is connected between a first power supply terminal and the first detection terminal, and a control terminal of the first switching device is electrically connected to the first node;
    the second switching device is connected between the first power supply terminal and the second detection terminal, and a control terminal of the second switching device is electrically connected to the second node;
    the third switching device is connected between a second power supply terminal and the first detection terminal, and a control terminal of the third switching device is electrically connected to the second node; and
    the fourth switching device is connected between the second power supply terminal and the second detection terminal, and a control terminal of the fourth switching device is electrically connected to the first node.

5. The drive circuit of claim 4, wherein each of the first switching device, the second switching device, the third switching device and the fourth switching device is an N-type metal oxide semiconductor (MOS) transistor, and a voltage of the first power supply terminal is greater than a voltage of the second power supply terminal.

6. The drive circuit of claim 3, wherein the excitation unit is configured to adjust the first input signal when detecting that the potential of the first detection terminal is greater than the potential of the second detection terminal, so that a potential difference between the first detection terminal and the second detection terminal is reduced; and
    the excitation unit is further configured to adjust the second input signal when detecting that the potential of the first detection terminal is less than the potential of the second detection terminal, so that the potential difference between the first detection terminal and the second detection terminal is reduced.

7. The drive circuit of claim 6, wherein the excitation unit comprises a main control chip and an excitation circuit, and the excitation circuit comprises a first excitation device and a second excitation device;

a first drive terminal of the first excitation device is electrically connected to a first control terminal of the main control chip, a second drive terminal of the first excitation device is electrically connected to the first detection terminal, an input terminal of the first excitation device is electrically connected to a third power supply terminal of the main control chip, and an output terminal of the first excitation device is electrically connected to the second signal line; and a first drive terminal of the second excitation device is electrically connected to a second control terminal of the main control chip, a second drive terminal of the second excitation device is electrically connected to the second detection terminal, an input terminal of the second excitation device is electrically connected to a fourth power supply terminal of the main control chip, and an output terminal of the second excitation device is electrically connected to the first signal line.

8. The drive circuit of claim 6, wherein the excitation unit comprises a fifth switching device, a sixth switching device, a seventh switching device and an eighth switching device;
the fifth switching device is connected between the third power supply terminal and the second signal line, and a control terminal of the fifth switching device is electrically connected to the first detection terminal;
the sixth switching device is connected between the third power supply terminal and the second signal line, and a control terminal of the sixth switching device is electrically connected to the first control terminal;
the seventh switching device is connected between the fourth power supply terminal and the first signal line, and a control terminal of the seventh switching device is electrically connected to the second detection terminal; and
the eighth switching device is connected between the fourth power supply terminal and the first signal line, and a control terminal of the eighth switching device is electrically connected to the second control terminal.

9. The drive circuit of claim 8, wherein each of the fifth switching device, the sixth switching device, the seventh switching device and the eighth switching device is an N-type metal oxide semiconductor (MOS) transistor, and each of the third power supply terminal and the fourth power supply terminal is a high potential.

10. The drive circuit of claim 8, wherein a working process of the drive circuit within one frame of display picture comprises a potential detection stage for detecting the potential of the first node and the potential of the second node, and other stages except the potential detection stage; and
each of the first control terminal and the second control terminal is a low potential in the potential detection stage, and each of the first control terminal and the second control terminal is a high potential in the other stages.

11. The drive circuit of claim 1, further comprising: a plurality of cascaded second shift registers, and a shift register output terminal of a triggered last-stage second shift register of the plurality of cascaded second shift registers is electrically connected to a shift trigger input terminal of the first shift register.

12. The drive circuit of claim 11, wherein the first shift register comprises an input module, a voltage dividing module, and an output module;
an output terminal of the input module is electrically connected to the first node, the output module is coupled with the first node through a coupling capacitor, a control terminal of the voltage dividing module is connected to the first node, and the voltage dividing module comprises the second node;
the input module is configured to adjust the potential of the first node; and
the voltage dividing module is configured to adjust the potential of the second node.

13. The drive circuit of claim 12, wherein an input terminal of the input module is electrically connected to the first signal line, and a first input terminal of the voltage dividing module is electrically connected to the second signal line; and
the drive module is configured to pull down the first input signal or the second input signal according to the detected potential of the first node and the detected potential of the second node.

14. The drive circuit of claim 12, wherein the first shift register comprises a shut-down module and a reset module;
an output terminal of the shut-down module is electrically connected to the first node and the shut-down module is configured to reduce the potential of the first node; and
an output terminal of the reset module is electrically connected to the first node and the reset module is configured to reset the first node.

15. The drive circuit of claim 14, wherein an input terminal of the shut-down module is electrically connected to the first signal line, and a first input terminal of the voltage dividing module is electrically connected to the second signal line; and
the drive module is configured to pull down the first input signal or pull down the second input signal according to the detected potential of the first node and the detected potential of the second node.

16. The drive circuit of claim 14, wherein a control terminal of the reset module is electrically connected to the first signal line, and a first input terminal of the voltage dividing module is electrically connected to the second signal line; and
the drive module is configured to pull up the first input signal or pull down the second input signal according to the detected potential of the first node and the detected potential of the second node.

17. The drive circuit of claim 1, wherein a working process of the drive circuit within one frame of display picture comprises at least: a display stage, a display blank stage, and a potential detection stage for detecting the potential of the first node and the potential of the second node; and
part of a time period of the display blank stage overlaps a time period of the potential detection stage.

18. The drive circuit of claim 17, wherein the time period of the display blank stage overlaps the time period of the potential detection stage.

19. The drive circuit of claim 17, wherein the working process of the drive circuit within one frame of display picture comprises a plurality of potential detection stages; and
at least part of the time period of the display blank stage overlaps time periods of the plurality of potential detection stages.

20. A display device, comprising a drive circuit, wherein the drive circuit comprises:
a first shift register, a first signal line and a second signal line, wherein the first shift register comprises a first node and a second node, the first signal line is configured to provide a first input signal for the first shift register, the second signal line is configured to provide a second input signal for the first shift register, and the first shift register is configured to control a potential of the first node and a potential of the second node according to the first input signal and the second input signal; and a drive module separated from the first shift register, wherein the drive module electrically is connected to the first node, the second node, the first signal line and the second signal line, wherein the drive module is configured to detect the potential of the first node and the potential of the second node, and adjust at least one of the first input signal or the second input signal according to the detected potential result of the first node and the detected potential of the second node in order to reduce a potential difference between the potential of the first node and the potential of the second node.

\* \* \* \* \*